US008883065B2

(12) United States Patent
Kodama et al.

(10) Patent No.: US 8,883,065 B2
(45) Date of Patent: Nov. 11, 2014

(54) CURABLE COMPOSITION FOR IMPRINTS, PATTERNING METHOD AND PATTERN

(75) Inventors: Kunihiko Kodama, Haibara-gun (JP); Kyouhei Sakita, Haibara-gun (JP); Hiroyuki Yonezawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 470 days.

(21) Appl. No.: 13/132,717

(22) PCT Filed: Dec. 2, 2009

(86) PCT No.: PCT/JP2009/070576
§ 371 (c)(1),
(2), (4) Date: Jun. 3, 2011

(87) PCT Pub. No.: WO2010/064726
PCT Pub. Date: Jun. 10, 2010

(65) Prior Publication Data
US 2011/0236595 A1 Sep. 29, 2011

(30) Foreign Application Priority Data

Dec. 3, 2008 (JP) ................................ 2008-308838
Jan. 14, 2009 (JP) ................................ 2009-005590
Jul. 29, 2009 (JP) ................................ 2009-176416

(51) Int. Cl.
B29C 35/08 (2006.01)
C08F 2/48 (2006.01)
C08F 220/16 (2006.01)
B82Y 40/00 (2011.01)
C09D 4/00 (2006.01)
B82Y 10/00 (2011.01)
G03F 7/00 (2006.01)

(52) U.S. Cl.
CPC . *C08F 2/48* (2013.01); *B82Y 40/00* (2013.01); *C09D 4/00* (2013.01); *B82Y 10/00* (2013.01); *G03F 7/0002* (2013.01)
USPC ............................ 264/496; 522/172; 522/187

(58) Field of Classification Search
USPC ................................................. 522/172, 187
See application file for complete search history.

(56) References Cited

U.S. PATENT DOCUMENTS

| 2,404,267 A | 7/1946 | Barnes | |
| 5,259,926 A | 11/1993 | Kuwabara et al. | |
| 5,661,194 A * | 8/1997 | Ando et al. | 523/107 |
| 5,772,905 A | 6/1998 | Chou | |
| 5,956,216 A | 9/1999 | Chou | |
| 6,184,323 B1 * | 2/2001 | Jiang | 526/286 |
| 7,144,954 B2 | 12/2006 | Schmitt et al. | |
| 7,754,781 B2 | 7/2010 | Sanai et al. | |
| 2005/0261421 A1 | 11/2005 | Schmitt et al. | |
| 2006/0128853 A1 * | 6/2006 | Olson | 524/261 |
| 2007/0172772 A1 * | 7/2007 | Ozawa et al. | 430/321 |
| 2008/0194727 A1 * | 8/2008 | Sanai et al. | 522/154 |
| 2009/0219461 A1 * | 9/2009 | Zhou et al. | 349/62 |
| 2009/0270576 A1 * | 10/2009 | Hunt et al. | 526/326 |
| 2009/0283937 A1 | 11/2009 | Kodama et al. | |

FOREIGN PATENT DOCUMENTS

| BE | 631 427 A1 | 11/1963 |
| CN | 1703398 A | 11/2005 |
| CN | 1977189 A | 6/2007 |
| CN | 101120061 A | 2/2008 |
| CN | 101128490 A | 2/2008 |
| EP | 1 808 447 A1 | 7/2007 |
| EP | 1 857 469 A1 | 11/2007 |
| JP | 2906245 B2 | 6/1990 |
| JP | 2926262 B2 | 3/1992 |
| JP | 11-100378 A | 4/1999 |
| JP | 2004-240241 A | 8/2004 |
| JP | 2005-197699 A | 7/2005 |
| JP | 2005-301289 A | 10/2005 |
| JP | 2006-310565 A | 11/2006 |
| JP | 2007-186570 A | 7/2007 |
| JP | 2008-105414 A | 5/2008 |
| JP | 2009-073078 A | 4/2009 |
| JP | 2010-186979 A | 8/2010 |
| WO | 2006/065542 A1 | 6/2006 |
| WO | 2009/101913 A1 | 8/2009 |

OTHER PUBLICATIONS

Fontaine Shan UV Cured High Reflex Index Materials, http://www.fontaineshan.com/wp-content/uploads/ckfinder/files/UVcredHighReflexIndexMaterial.pdf (downloaded Sep. 21, 2013).*
Office Action dated May 30, 2013 from the State Intellectual Property Office of P.R. China in Chinese Application No. 200980148599.0.
Office Action dated Jul. 3, 2012 in Chinese Application No. CN 2009 80148599.0.
Database Beilstein, Beilstein Institute for Organic Chemistry, 2007, J. Org. Chem., 1994, XP002590344, Database Accession No. 6920752 (BRN), pp. 4925-4930, vol. 59, No. 17.
Database Beilstein, Beilstein Institute for Organic Chemistry, 2007, J. Org. Chem., 1996, XP002590345, Database Accession No. 3268141 (BRN), pp. 5406-5413, vol. 61, No. 16.
Database Beilstein, Beilstein Institute for Organic Chemistry, 2007, Tetrahedron LEFTT., 2004, XP002590346, Database Accession No. 9847772 (BRN), pp. 6203-6206, vol. 45, No. 32.
Database Beilstein, Beilstein Institute for Organic Chemistry, 2007, Tetrahedron LETT., 2002, XP002590347, Database Accession No. 9192477, pp. 6343-6346, vol. 43, No. 36.
Stephen Y. Chou, et al., "Imprint of sub-25 nm vias and trenches in polymers", Appl. Phys. Lett., American Institute of Physics, Nov. 20, 1995, pp. 3114-3116, vol. 67, No. 21.
M. Colburn, et al., "Step and Flash Imprint Lithography: A New Approach to High-Resolution Patterning", Proc. SPIE, Mar. 1999, pp. 379-389, vol. 3676.

(Continued)

*Primary Examiner* — Vu A Nguyen
(74) *Attorney, Agent, or Firm* — Sughrue Mion, PLLC

(57) ABSTRACT

Provided is a curable composition for imprints having good patternability and dry etching resistance. Disclosed is a curable composition for imprints comprising a polymerizable monomer (Ax) having a substituent having an aromatic group and having a molecular weight of 100 or more, and a photopolymerization initiator.

17 Claims, No Drawings

(56) References Cited

OTHER PUBLICATIONS

Lecture of Experimental Chemistry 20, 4th Ed., Organic Synthesis II, 1992, pp. 213-224, ff. Maruzen.

Alfred Hassner, editor, "The chemistry of heterocyclic compounds—Small Ring Heterocycles Part 3", Oxiranes, pp. 1-197, John Wiley and Sons, An Interscience Publication, New York, 1985.

Yoshimura, Adhesive: Technology on Adhesion & Sealing, 1985 pp. 32-39, vol. 29, No. 12.

Yoshimura, Adhesive: Technology on Adhesion & Sealing, 1986, pp. 42-47, vol. 30, No. 7.

Yoshimura, Adhesive: Technology on Adhesion & Sealing, 1986, pp. 42-47, vol. 30, No. 5.

Stephen C. Lapin, "Vinyl Ether Functionalized Urethane Oligomers: an Alternative to Acrylate Based Systems", Polymers Paint Colour Journal, 1988, pp. 321-328, vol. 179, No. 4237.

Office Action dated Sep. 10, 2013 in Japanese Application No. 2009-176416.

Office Action dated Nov. 14, 2013 in Chinese Application No. 200980148599.0.

* cited by examiner

CURABLE COMPOSITION FOR IMPRINTS, PATTERNING METHOD AND PATTERN

CROSS REFERENCE TO RELATED APPLICATIONS

This application is a National Stage of International Application No. PCT/JP2009/070576 filed Dec. 2, 2009, claiming priority based on Japanese Patent Application Nos. 2008-308838, filed Dec. 3, 2008, 2009-005590 filed Jan. 14, 2009 and 2009-176416 filed Jul. 29, 2009, the contents of all of which are incorporated herein by reference in their entirety.

TECHNICAL FILED

The present invention relates to a curable composition for imprints, a patterning method and a pattern.

BACKGROUND ART

Imprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photocurable composition (for example, see M. Colbun, et al., Proc. SPIE, Vol. 3676, 379 (1999)). In the thermal imprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose a imprint method of forming nanopatterns inexpensively.

On the other hand, in the photoimprint method where a composition for photoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the imprint methods as above, proposed are applied technologies to nano-scale mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of µ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned imprint technologies and their applied technologies has become active for practical use thereof.

As one example of imprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, imprint lithography, particularly nanoimprint lithography (photonanoimprint technology) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of imprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of imprint technology is proposed. The application also requires micropatternability on a level of a few tens nm and high-level etching resistance of the micropattern functioning as a mask in substrate processing.

Next described is an application example of imprint technology to flat displays such as liquid-crystal displays (LCD) and plasma display panels (PDP).

With the recent tendency toward large-sized LCD substrates and PDP substrates for high-definition microprocessing thereon, photoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 µm or 20 µm or so is formed through photolithography, and this is further thermally cured through past-baking to form the intended spacer.

Further, imprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in imprint technology, which is therefore specifically noted as a technology capable of forming micropatterns inexpensively.

In the case where nanoimprint is industrially utilized, various properties depending on an intended use such as described above are required in addition to good patternability. For example, in application for a fabricated substrate, high-level etching resistance is required.

JP-A-2006-310565 and JP-A-2007-186570 suggest a composition comprising a cyclic monomer or a composition satisfying a particular parameter for the purpose of improving dry etching resistance. However, those compositions are not sufficient from the viewpoints of achievement of patternability and dry etching resistance.

SUMMARY

As described above, a composition satisfying high-level patternability and high-level dry etching resistance has been studied. However, a composition excellent in both of patternability and dry etching resistance has not been provided. It is an object of the present invention to solve the above problem, and to provide a curable composition for imprints which is excellent in patternability and dry etching resistance.

Given the situation as above, the present inventors have assiduously studied and has found that a curable composition for imprints which is excellent in patternability and dry etching resistance tends to be obtained by using a (meth)acrylate having an aromatic group and satisfying a particular requirement. In particular, while a curable composition excellent in patternability and dry etching resistance is not obtained by using benzylacrylate, which is a representative acrylate having an aromatic group, a composition excellent in both of patternability and dry etching resistance is obtained by using the (meth)acrylate defined in the present invention. Therefore, the composition of the present invention is extremely innovative.

Specifically, the present problem has solved by the following means;

[1] A curable composition for imprints comprising a polymerizable monomer (Ax) and a photopolymerization initiator, wherein the polymerizable monomer (Ax) is represented by the following formula (I);

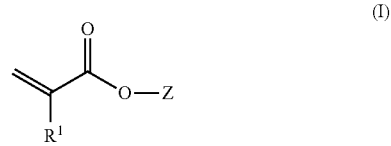

wherein $R^1$ represents a hydrogen atom, an alkyl group, or a halogen atom; Z is a group having an aromatic group and having a molecular weight of 100 or more; and, when the polymerizable monomer (Ax) is liquid at 25° C., the polymerizable monomer (Ax) has a viscosity of 500 mPa·s or less.

[2] The curable composition for imprints according to [1], wherein Z in the formula (I) represents $—Z^1—Z^2$; wherein $Z^1$ is a single bond, or a hydrocarbon group which may have a linking group containing a hetero atom in the chain of the linking group; $Z^2$ is an aromatic group having a molecular weight of 90 or more; and $Z^2$ may have a substituent.

[3] The curable composition for imprints according to [1], wherein the polymerizable monomer (Ax) is a compound represented by the following formula (II);

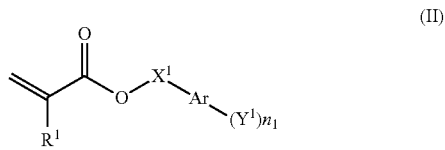

wherein $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3; when n1 is 0, $X^1$ is a hydrocarbon group having two or more carbon atoms; and Ar is a phenylene group, or an aromatic group having two or more aromatic rings bonded to each other in series.

[4] The curable composition for imprints according to [1], wherein the polymerizable monomer (Ax) is a compound represented by the following formula (III);

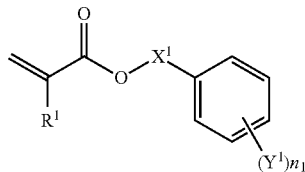

wherein $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3; and, when n1 is 0, $X^1$ is a hydrocarbon group having two or more carbon atoms.

[4-2] The curable composition for imprints according to [4], wherein $X^1$ is an alkylene group.

[4-3] The curable composition for imprints according to [4], wherein $X^1$ is —$CH_2$—.

[5] The curable composition for imprints according to [1], wherein the polymerizable monomer (Ax) is a compound represented by the following formula (IV);

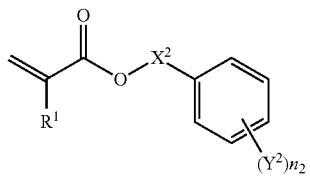

wherein $R^1$ represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3; and, when n2 is 0, $X^2$ is a hydrocarbon group having two or three carbon atoms.

[5-2] The curable composition for imprints according to [5], wherein $X^2$ in the formula (IV) is an alkylene group.

[5-3] The curable composition for imprints according to [5], wherein $X^2$ in the formula (IV) is —$CH_2$—.

[6] The curable composition for imprints according to [5], wherein, in the formula (IV), $R^1$ is a hydrogen atom, or a methyl group; $X^2$ is a single bond, or a hydrocarbon group having 1 to 3 carbon atoms; $n^2$ is an integer of 0 to 2; and, when n2 is 2, $X^2$ is a hydrocarbon group having one carbon atom.

[7] The curable composition for imprints according to [5] or [6], wherein the compound represented by the formula (IV) has a molecular weight of 175 to 250.

[8] The curable composition for imprints according to any one of [5] to [7], wherein the compound represented by the formula (IV) has a viscosity of 6 mPa·s or less at 25° C.

[9] The curable composition for imprints according to [1], wherein the polymerizable monomer (Ax) is a compound represented by the following formula (V);

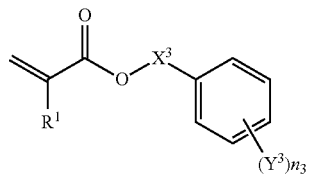

wherein $R^1$ represents a hydrogen atom, an alkyl group, or a halogen atom; $X^3$ is a single bond, or a hydrocarbon group which may have a linking group containing a hetero atom in the chain of the linking group; $Y^3$ represents a substituent having an aromatic group and having a molecular weight of 15 or more; and n3 represents an integer of 1 to 3.

[9-2] The curable composition for imprints according to [9], wherein $X^3$ in the formula (V) is an alkylene group.

[9-3] The curable composition for imprints according to [9], wherein $X^3$ in the formula (V) is —$CH_2$—.

[10] The curable composition for imprints according to [9], wherein $R^1$ is a hydrogen atom, or an alkyl group, and $X^3$ is a single bond, or an alkylene group.

[11] The curable composition for imprints according to [1], wherein the polymerizable monomer (Ax) is a compound represented by the following formula (VI);

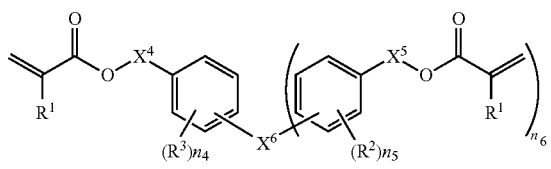

wherein $X^6$ is a (n6+1)-valent linking group; $R^1$ each are a hydrogen atom, an alkyl group, or a halogen atom; $R^2$ and $R^3$ each are a substituent; n4 and n5 each are an integer of 0 to 4; n6 is 1 or 2; and $X^4$ and $X^5$ each are a hydrocarbon group which may have a linking group containing a hetero atom in the chain of the linking group.

[11-2] The curable composition for imprints according to [11], wherein $X^4$ and $X^5$ in the formula (V) each are an alkylene group.

[11-3] The curable composition for imprints according to [11], wherein $X^4$ and $X^5$ in the formula (V) each are —$CH_2$—.

[12] The curable composition for imprints according to [11], wherein $X^4$ and $X^5$ in the formula (VI) each are an alkylene group, the alkylene group being free from a linking group.

[13] The curable composition for imprints according to any one of [1] to [12], which further comprises a polymerizable monomer different from the polymerizable monomer (Ax).

[14] The curable composition for imprints according to [13], wherein the polymerizable monomer different from the polymerizable monomer (Ax) is a monofunctional (meth)acrylate having an aromatic structure and/or an alicyclic hydrocarbon structure.

[15] The curable composition for imprints according to any one of [1] to [14], which further comprises a polymerizable compound having a fluorine atom and/or a silicon atom.

[16] The curable composition for imprints according to any one of [1] to [15], which further comprises an antioxidant and/or a surfactant.

[17] The curable composition for imprints according to any one of [1] to [16], which comprises 30% by mass or less of polymerizable monomers having a molecular weight of 2000 or more, relative to the total amount of all the polymerizable monomers contained in the composition.

[18] A cured product of the curable composition for imprints according to any one of [1] to [17].

[19] A method for manufacturing a cured product comprising;
applying the curable composition for imprints according to any one of [1] to [17] onto a substrate to form a patterning layer thereon,
pressing a mold against the surface of the patterning layer, and
irradiating the patterning layer with light.

[20] A reaction diluent comprising a compound represented by the following formula (IV);

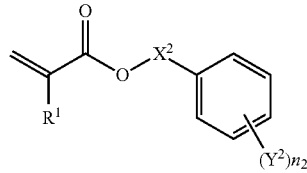

(IV)

wherein $R^1$ represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3; and, when n2 is 0, $X^2$ is a hydrocarbon group having two or three carbon atoms.

[21] The curable composition for imprints according to any one of [1] to [17], wherein the polymerizable monomer (Ax) has a benzyl(meth)acrylate skeleton.

[22] The curable composition for imprints according to any one of [1] to [17], wherein the polymerizable monomer (Ax) is a partial derivative of benzyl(meth)acrylate.

[23] The curable composition for imprints according to [13] or [14], wherein the polymerizable monomer (Ax) is a polyfunctional (meth)acrylate having a benzyl(meth)acrylate skeleton.

The composition of the present invention can provide a cured article which exhibits a good patternability and has an excellent dry etching resistance.

DETAILED DESCRIPTION OF INVENTION

The contents of the present invention are described in detail hereinunder. In this specification, the numerical range expressed by the wording "a number to another number" means the range that falls between the former number indicating the lowermost limit of the range and the latter number indicating the uppermost limit thereof. In this specification, mass ratio is equal to weight ratio.

In this specification, "(meth)acrylate" means acrylate and methacrylate; "(meth)acrylic" means acrylic and methacrylic; "(meth)acryloyl" means acryloyl and methacryloyl. In the present invention, monomer is differentiated from oligomer and polymer, and the monomer indicates a compound having a weight-average molecular weight of at most 1,000. In this specification, "functional group" means a group participating in polymerization. "Imprint" referred to in the present invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this specification, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints in the Present Invention]

The curable composition for imprints in the present invention (which may be hereinafter simply referred to as the "composition of the present invention") is a curable composition for imprints comprising one or more polymerizable monomers and a photopolymerization initiator, wherein at least one of the polymerizable monomers is a polymerizable monomer (Ax) represented by the following formula (I);

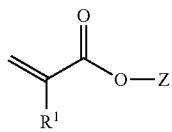

(I)

wherein $R^1$ represents a hydrogen atom, an alkyl group, or a halogen atom; Z is a group having an aromatic group and having a molecular weight of 100 or more; and, when the polymerizable monomer (Ax) is liquid at 25° C., the polymerizable monomer (Ax) has a viscosity of 500 mPa·s or less.

$R^1$ is preferably a hydrogen atom, or an alkyl group, more preferably a hydrogen atom, or a methyl group, further more preferably a hydrogen atom from the viewpoint of the curability of the composition. Examples of the halogen atom include fluorine atom, chlorine atom, bromine atom, and iodine atom, and preferred is fluorine atom.

Z is an aralkyl group which may have a substituent, an aryl group which may have a substituent, or a group in which those groups are bonded to each other via a linking group. The linking group may include a hetero atom. The linking group is preferably —CH$_2$—, —O—, —C(=O)—, —S—, or a combination thereof. The aromatic group contained in Z is preferably a phenyl group. More preferably, z contains only a phenyl group as the aromatic group. Compared with a group containing a polyaromatic group, or a heteroaromatic group, the group having only a phenyl group as the aromatic group contained in Z attains low viscosity and good patternability, and reduces particle failure. The molecular weight of Z is preferably 100 to 300, more preferably 120 to 250.

The number of the polymerizable groups in the polymerizable monomer (Ax) is preferably not more than the number of the aromatic groups in view of the viscosity of the composition and dry etching resistance (the number of polymerizable groups≤the number of aromatic groups). In the case of a condensed ring such as naphthalene, it is counted as one aromatic group. In the case where two or more aromatic rings are bonded via a single bond or a linking group such as a biphenyl group, it is counted as two or more aromatic groups.

When the polymerizable monomer (Ax) is liquid at 25° C., the viscosity thereof is preferably 2 to 500 mPa·s at 25° C., more preferably 3 to 200 mPa·s, further more preferably 3 to 100 mPa·s. The polymerizable monmer (Ax) is preferably liquid at 25° C., or solid having a melting point of 60° C. or less, more preferably liquid at 25° C., or solid having a melting point of 25° C. or less.

Z preferably represents —$Z^1$—$Z^2$. $Z^1$ is a single bond, or a hydrocarbon group which may have a linking group containing a hetero atom in the chain thereof. $Z^2$ is an aromatic group which may have a substituent. $Z^2$ has a molecular weight of 90 or more.

$Z^1$ is preferably a single bond, or an alkylene group which may have a linking group containing a hetero atom in the chain of the linking group. $Z^1$ is more preferably an alkylene group not having a linking group containing a hetero atom in the chain thereof, more preferably a methylene group, or an ethylene group. Examples of the linking group containing a hetero atom include —O—, —C(=O)—, —S—, and a combination of an alkylene group and at least one of —O—, —C(=O)— and —S—. The number of the carbon atoms of $Z^1$ is preferably 1 to 3.

$Z^2$ is preferably an aromatic group having a substituent having a molecular weight of 15 or more. Examples of the aromatic group in $Z^2$ include a phenyl group and a naphthyl group. $Z^2$ is more preferably a phenyl group having a substituent having a molecular weight of 15 or more. $Z^2$ preferably comprises a monocyclic aromatic group.

$Z^2$ is also preferably a group in which two or more aromatic groups directly bond to each other, or a group in which two or more aromatic groups bond to each other via a linking group. The linking group is preferably —$CH_2$—, —O—, —C(=O)—, —S—, or a combination thereof.

Examples of a substituent which the aromatic group may have include a halogen atom (fluorine atom, chlorine atom, bromo atom, iodine atom), a linear, a branched, or a cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxy group, an alkoxy group, an aryloxy group, an alkylthio group, an arylthio group, a heterocyclic-oxy group, an acyloxy group, an amino group, a nitro group, a hydrazino group, a heterocyclic group. A group which is substituted with those groups is also preferred.

The polymerizable monomer (Ax) is preferably liquid at 25° C. When the polymerizable monomer (Ax) is liquid, the viscosity at 25° C. is 500 mPa·s or less, preferably 300 mPa·s or less, more preferably 200 mPa·s or less, further more preferably 100 mPa·s or less.

The amount of the compound represented by the formula (I) to be added in the composition is preferably 10 to 100% by mass, more preferably 20 to 100% by mass, furthermore preferably 30 to 80% by mass.

The compound represented by the formula (I) is preferably represented by the following formula (II);

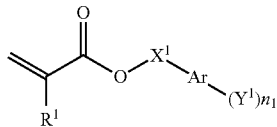

(II)

wherein $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3; when n1 is 0, $X^1$ is a hydrocarbon group having two or more carbon atoms; and Ar is a phenylene group, or an aromatic group having two or more aromatic rings bonded to each other in series.

Ar is preferably a phenylene group.

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above. $Y^1$ is a substituent having a molecular weight of 15 or more. Examples of $Y^1$ include an alkyl group, an alkoxy group, an aryloxy group, an alkenyl group, an aralkyl group, an acyl group, an alkoxycarbonyl group, an alkylthio group, an arylthio group, and a halogen atom. Those substituents may have a substituent.

When n1 is 0, $X^1$ is preferably an alkylene group having 2 or 3 carbon atoms. When n1 is 2, $X^1$ is preferably a hydrocarbon group having 1 carbon atom.

In particular, the more preferred embodiment is that n1 is 1 and $X^1$ is an alkylene group having 1 to 3 carbon atoms.

The compound represented by the formula (II) is more preferably represented by the following formula (III);

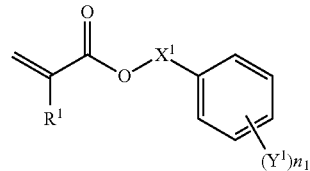

(III)

wherein $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3; and, when n1 is 0, $X^1$ is a hydrocarbon group having two or more carbon atoms.

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above.

$Y^1$ is the same as $Y^1$ in the above formula (II) and the preferable range thereof is the same as $Y^1$ in the above formula (II).

n1 is the same as n1 in the above formula (II) and the preferable range thereof is the same as n1 in the above formula (II).

The compound represented by the formula (III) is further preferably a compound represented by any one of the formulae (IV) to (VI).

The compound represented by the formula (IV);

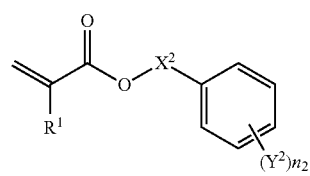

(IV)

wherein $R^1$ represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3; and, when n2 is 0, $X^2$ is a hydrocarbon group having two or three carbon atoms.

$R^1$ is the same as $R^1$ in the above formula (I) and the preferable range thereof is the same as $R^1$ in the above formula (I).

When $X^2$ is a hydrocarbon group, $X^2$ is preferably a hydrocarbon group having 1 to 3 carbon atoms, more preferably a substituted or unsubstituted alkylene group having 1 to 3 carbon atoms, furthermore preferably an unsubstituted alkylene group having 1 to 3 carbon atoms, still more preferably an ethylene group. By applying such a hydrocarbon group, it makes possible to provide a composition having lower viscosity and lower volatility.

$Y^2$ represents a substituent which has a molecular weight of 15 or more and the substituent is not an aromatic group-containing group. The upper limit of the molecular weight of $Y^2$ is preferably 80 or less. Examples of $Y^2$ include an alkyl group having 1 to 6 carbon atoms such as methyl group, ethyl group, isopropyl group, tert-butyl group, and cyclohexyl group, an alkenyl group having 2 to 6 carbon atoms such as an allyl group, a halogen atom such as chlorine atom and bromo atom, and an alkoxy group having 1 to 6 carbon atoms such as methoxy group, ethoxy group, and cyclohexyloxy group.

n2 is preferably an integer of 0 to 2. When n2 is 1, the substituent $Y^2$ is preferably at para-position in the compound. When n2 is 2, $X^2$ is preferably a single bond, or a hydrocarbon group having one carbon atom from the viewpoint of the viscosity of the composition.

The compound represented by the formula (IV) is preferably a monofunctional (meth)acrylate having one (meth)acrylate.

The molecular weight of the (meth)acrylate represented by the formula (IV) is preferably 175 to 250, more preferably 185 to 245 from the viewpoint of attainment of the low viscosity and the low volatility.

The viscosity at 25° C. of the (meth)acrylate represented by the formula (IV) is preferably 10 mPa·s or less, more preferably 6 mPa·s or less.

In addition, the compound represented by the formula (IV) preferably is used for a reaction diluent.

The amount of the compound represented by the formula (IV) to be added is preferably 10% by mass or more, more preferably 15% by mass or more, further more preferably 20% by mass or more from the viewpoint of the viscosity of the composition and the pattern accuracy of the cured film. While the amount thereof to be added is preferably 95% by mass or less, more preferably 90% by mass or less, further more preferably 85% by mass or less from the viewpoint of the tackiness of the cured film and the mechanical strength of the cured film.

Specific examples of the compounds represented by Formula (IV) are shown below, to which, however, the present invention should not be limited.

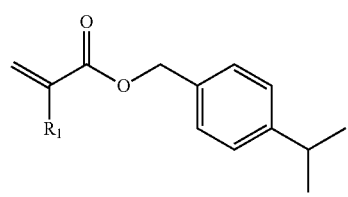

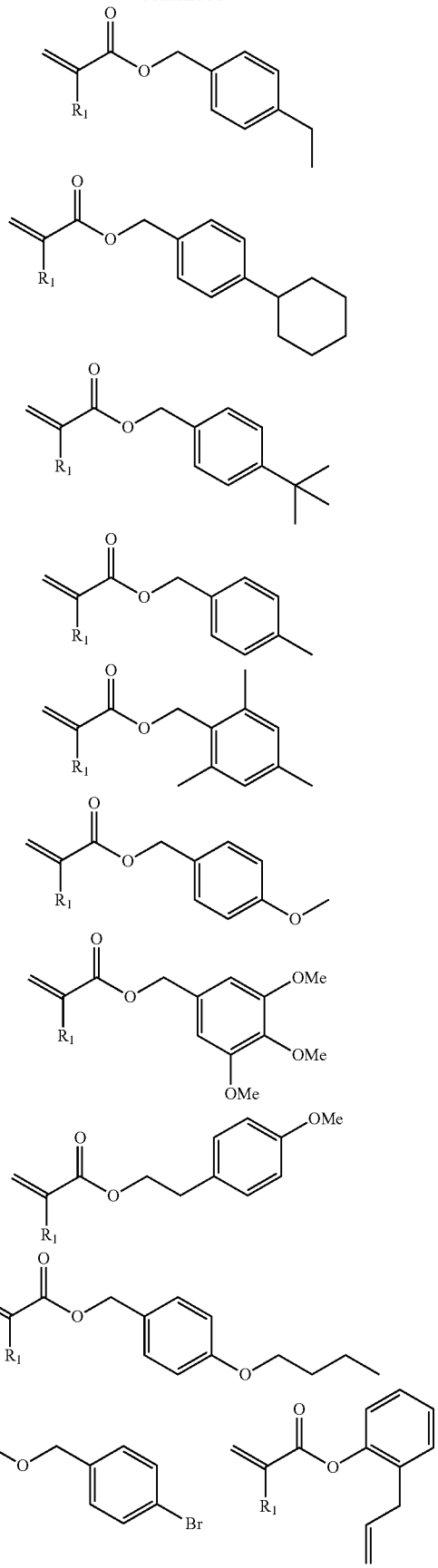

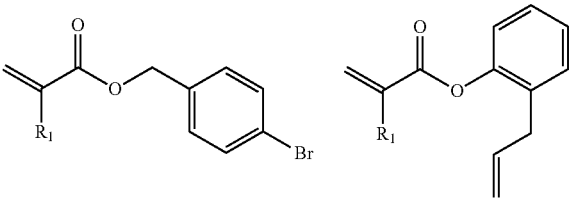

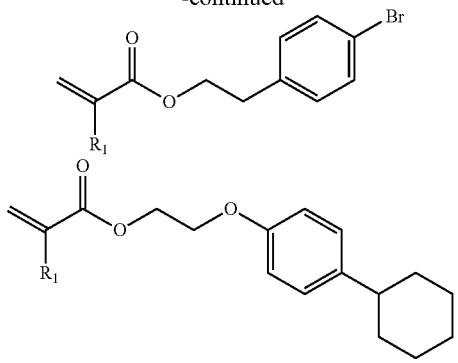

The compound represented by the formula (V);

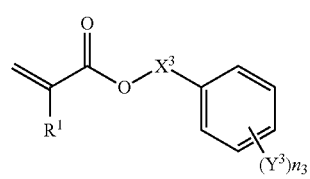

wherein R¹ represents a hydrogen atom, an alkyl group, or a halogen atom; $X^3$ is a single bond, or a hydrocarbon group which may have a linking group containing a hetero atom in the chain of the linking group; $Y^3$ represents a substituent having an aromatic group and having a molecular weight of 15 or more; and n3 represents an integer of 1 to 3.

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above.

$Y^3$ represents a substituent having an aromatic group and having a molecular weight of 15 or more. Preferred embodiment of the substituent having an aromatic group is the embodiment that an aromatic group bonds to the aromatic ring in the formula (V) directly, or via a linking group. Preferred example of the linking group thereof include an alkylene group, a linking group containing a hetero atom (preferably —O—, —S—, —C(=O)O—) and a combination thereof. Among them, an alkylene group, —O— and a combination thereof is more preferable. The substituent having an aromatic group and having a molecular weight of 15 or more is preferably a substituent having a phenyl group. Embodiment in which a phenyl group bonds to the aromatic ring in the formula (V) directly, or via the above mentioned linking group is preferable. The substituent having an aromatic group and having a molecular weight of 15 or more is preferably a phenyl group, a benzyl group, a phenoxy group, a benzyloxy group and a phenylthio group. The molecular weight of $Y^3$ is preferably 230 to 350.

n3 is preferably 1 or 2, more preferably 1.

The amount of the compound represented by the formula (V) to be added is preferably 10% by mass or more, more preferably 20% by mass or more, further more preferably 30% by mass or more. On the other hand, the amount thereof is preferably 90% by mass or less, more preferably 80% by mass or less, further more preferably 70% by mass, from the viewpoint of the tackiness and mechanical strength of the cured film.

Specific examples of the compounds represented by Formula (V) are shown below, to which, however, the present invention should not be limited.

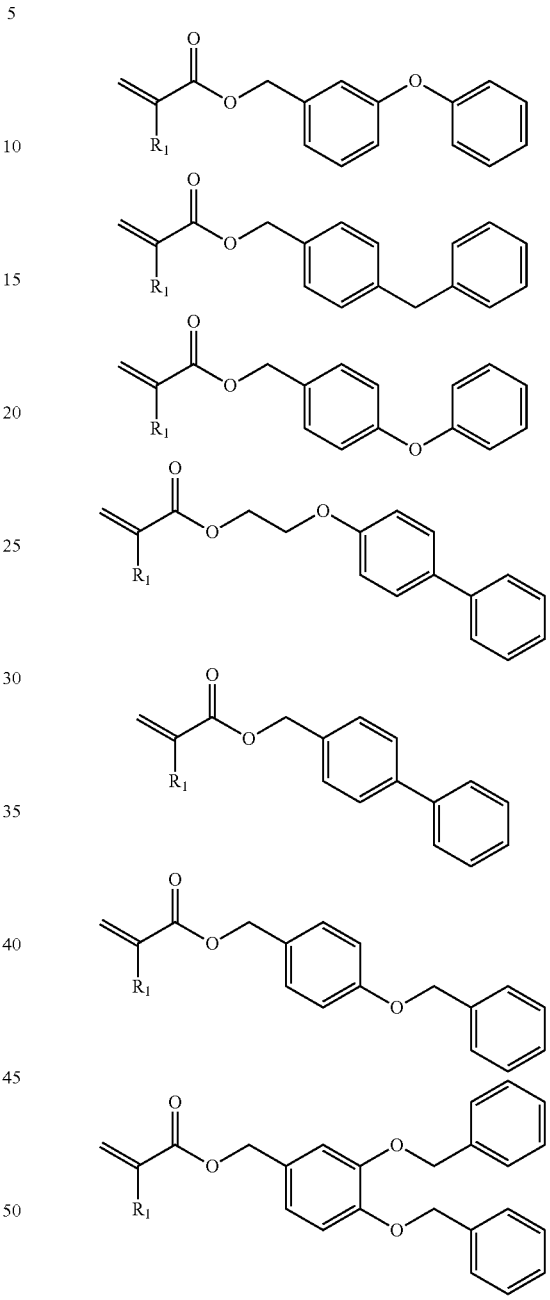

The compound represented by the formula (VI);

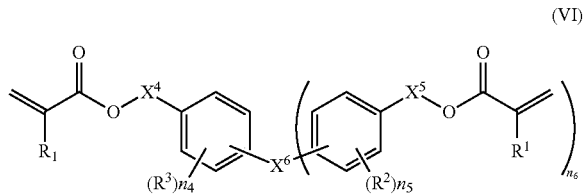

wherein $X^6$ is a (n6+1)-valent linking group; $R^1$ each are a hydrogen atom, an alkyl group, or a halogen atom; $R^2$ and $R^3$ each are a substituent; n4 and n5 each are an integer of 0 to 4; n6 is 1 or 2; and $X^4$ and $X^5$ each are a hydrocarbon group which may have a linking group containing a hetero atom in the chain of the linking group.

$X^6$ is a (n6+1)-valent linking group, preferably an alkylene group, —O—, —S—, —C(=O)O—, or a linking group consisting of a combination of two or more thereof. The alkylene group is preferably an alkylene group having 1 to 8 carbon atoms, more preferably an alkylene group having 1 to 3 carbon atoms. Also, the alkylene group is preferable an unsubstituted alkylene group.

n6 is preferably 1. When n6 is 2, the plural $R^1$, $X^5$ and $R^2$ existing in the formula may be the same or different.

$X^4$ and $X^5$ each are an alkylene group not having a linking group, more preferably an alkylene group having 1 to 5 carbon atoms, further more preferably an alkylene group having 1 to 3 carbon atoms, still more preferably a methylene group.

$R^1$ is the same as $R^1$ in the above formula (I) and the preferable range thereof is the same as $R^1$ in the above formula (I).

$R^2$ and $R^3$ each represent a substituent, preferably an alkyl group, a halogen atom, an alkoxy group, an acyl group, an acyloxy group, an alkoxycarbonyl group, a cyano group, a nitro group. The alkyl group is preferably an alkyl group having 1 to 8 carbon atoms. The halogen atom is exemplified by fluorine atom, chlorine atom, bromine atom and iodine atom, and is preferably fluorine atom. The alkoxy group is preferably an alkoxy group having 1 to 8 carbon atoms. The acyl group is preferably an acyl group having 1 to 8 carbon atoms. The acyloxy group is preferably an acyloxy group having 1 to 8 carbon atoms. The alkoxycarbonyl group is preferably an alkoxycarbonyl group having 1 to 8 carbon atoms.

n4 and n5 each are an integer of 0 to 4. When n4 or n5 is two or more, the plural $R^2$ and $R^3$ existing in the formula may be the same or different.

The compound represented by the formula (VI) is preferably a compound represented by the formula (VII);

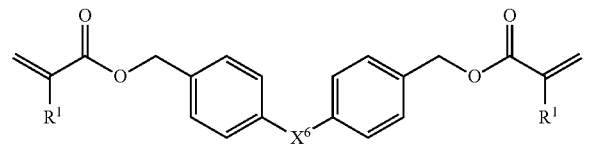

wherein $X^6$ represents an alkylene group, —O—, —S—, or a linking group which is combined with two or more thereof; $R^1$ each are a hydrogen atom, an alkyl group, or a halogen atom.

$R^1$ is the same as $R^1$ in the above formula (I) and the preferable range thereof is the same as $R^1$ in the above formula (I).

When $X^6$ is an alkylene group, the alkylene group is preferably an alkylene group having 1 to 8 carbon atoms, more preferably an alkylene group having 1 to 3 carbon atoms. The alkylene group is preferably an unsubstituted alkylene group.

$X^6$ is preferably —CH$_2$—, —CH$_2$CH$_2$—, —O—, or —S—.

The amount of the compound represented by the formula (VI) to be contained in the composition of the present invention is not defined. However, the content relative to the total amount of the polymerizable monomers is preferably 1 to 100% by mass, more preferably 5 to 70% by mass, further more preferably 10 to 50% by mass from the viewpoint of the curability and the viscosity of the composition.

Specific examples of the compounds represented by Formula (VI) are shown below, to which, however, the present invention should not be limited, wherein $R^1$ in the following is the same as $R^1$ in the above formula (VI), the preferable range thereof is the same as $R^1$ in the above formula (VI). The $R^1$ is more preferably a hydrogen atom.

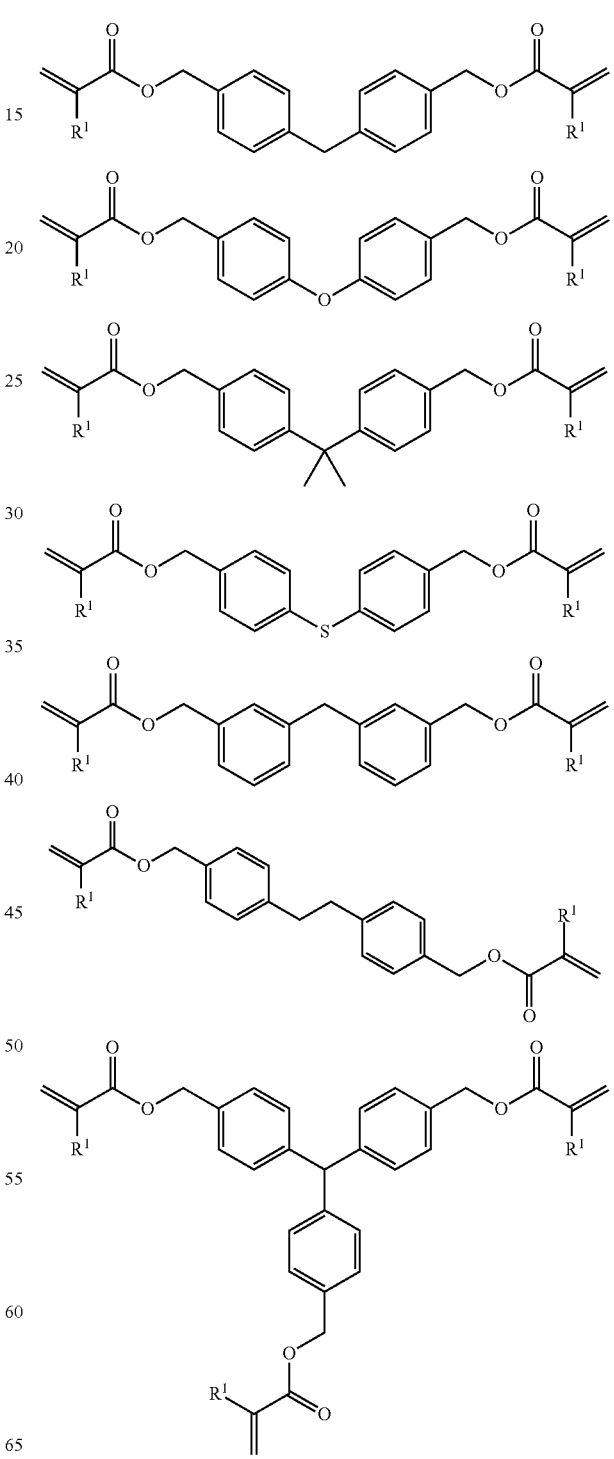

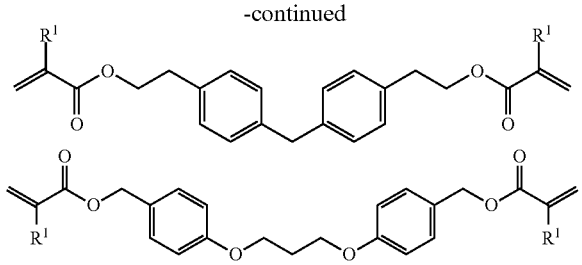

Other Polymerizable Monomer

In the composition of the present invention, it is preferred that, in addition to the polymerizable monomer (Ax), a polymerizable monomer other than the polymerizable monomer (Ax) is used from the viewpoint of the viscosity of the composition, the dry etching resistance, the imprint aptitude, and the curability.

When the other polymerizable monomer is used as well as the compound represented by the formula (IV), the other polymerizable monomer is preferably a polyfunctional polymerizable monomer, more preferably a polyfunctional (meth)acrylate, further more preferably difunctional or trifunctional (meth)acrylate.

When the other polymerizable monomer is used as well as the compound represented by the formula (V), the other polymerizable monomer is preferably a polyfunctional polymerizable monomer, more preferably a polyfunctional (meth)acrylate, further more preferably difunctional or trifunctional (meth)acrylate.

When the other polymerizable monomer is used as well as the compound represented by the formula (VI), the other polymerizable monomer is preferably a monofunctional polymerizable (meth)acrylate, more preferably a monofunctional (meth)acrylate having an aromatic structure and/or an alicyclic hydrocarbon structure.

Examples of the above other polymerizable monomer include a polymerizable unsaturated monomer having 1 to 6 of ethylenic unsaturated bond-having groups, a compound having an oxirane ring (an epoxy compound), a vinyl ether compound, a styrene derivative, a compound having a fluorine atom, propenyl ether, and butenyl ether. From the viewpoint of the curability of the composition, more preferred is a polymerizable unsaturated monomer having 1 to 6 of ethylenic unsaturated bond-having groups.

The polymerizable unsaturated monomer having from 1 to 6 of ethylenic unsaturated bond-having groups (from mono- to hexa-functional polymerizable unsaturated monomer) is described below.

The polymerizable unsaturated monomer having one ethylenic unsaturated bond-having group (mono-functional polymerizable unsaturated monomer) is preferably compounds described in JP-A-2009-73078, [0046].

Among the monofunctional polymerizable monomers having one ethylenically unsaturated bonds, a monofunctional (meth)acrylate compound having an alicyclic hydrocarbon structure is preferably used in the present invention for the purpose of enhancing the dry etching resistance. Examples of the monofunctional (meth)acrylate compound having an alicyclic hydrocarbon structure include dicyclopentanyl (meth)acrylate, dicyclopentanyloxyethyl (meth)acrylate, isobornyl (meth)acrylate, and adamantyl (meth)acrylate.

As the other polymerizable monomer, also preferred is a polyfunctional polymerizable unsaturated monomer having two ethylenic unsaturated bond-containing groups.

The polyfunctional polymerizable unsaturated monomer having two ethylenic unsaturated bond-containing groups is preferably compounds described in JP-A-2009-73078, [0047].

Of those, preferred for use in the present invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, and polyethylene glycol di(meth)acrylate.

The polyfunctional polymerizable unsaturated monomer having three or more ethylenic unsaturated bond-containing groups is preferably compounds described in JP-A-2009-73078, [0049].

Of those, preferred for use in the present invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, and pentaerythritol tetra(meth)acrylate.

Among the above-described (meth)acrylates, an acrylate compound is preferable from the viewpoint of the curability of the composition.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, and epoxidated polybutadienes. One or more of these compounds may be used either singly or as combined.

The oxirane ring-having compound preferably used in the present invention is compounds described in JP-A-2009-73078, [0053].

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, EpikoteCT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable monomer for use in the present invention, vinyl ether compounds may be used in the curable composition.

Any known vinyl ether compounds are usable, including compounds described in JP-A-2009-73078, [0057].

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the present invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

As the other polymerizable monomer, a polymerizable compound having fluorine atom and/or silicon atom may be also employed. Use of the polymerizable compound having a fluorine atom and/or a silicon atom enhances the patternability. The polymerizable monomer having fluorine atom is preferably a (meth)acrylate having a perfluoroalkyl group having 4 to 6 carbon atoms. Specific examples thereof include trifluoromethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, and fluorooctylethyl (meth)acrylate, tetrafluoropropyl (meth)acrylate. The polymerizable compound having silicon atom is preferably a compound having a polydimethyl siloxane structure, or a trimethylsilyl structure.

The polymerizable monomer having fluorine atom and/or silicon atom may be a polymer having a functional group having fluorine atom and/or silicon atom and a polyfunctional group.

The amount of the polymerizable monomer having fluorine atom and/or silicon atom to be added is preferably 0.01 to 10% by mass, more preferably 0.1 to 8% by mass, further preferably 0.3 to 5% by mass.

As the other polymerizable monomer for use in the present invention, propenyl ethers and butenyl ethers may also be employed. Preferred examples of the propenyl ethers or butenyl ethers include 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, and propenyl ether propylene carbonate.

The amount of the above-mentioned other polymerizable monomer to be added depends on the amount of the polymerizable monomer (Ax) used in the present invention to be added. For example, it may be 0 to 90% by mass, preferably 5 to 80% by mass, further more preferably 20 to 80% by mass, relative to all the polymerizable compounds. In the composition of the present invention, two or more kinds of the polymerizable compound (Ax) may be contained.

Next described is a preferable blend embodiment of the polymerizable monomer (Ax) in the present invention and the other polymerizable monomer.

A monofunctional polymerizable monomer is generally used as a reactive diluent, and has an effect of lowering the viscosity of the curable composition of the present invention, and it is preferably added in an amount of at least 15% by mass, more preferably from 20 to 90% by mass, even more preferably from 25 to 85% by mass, and particularly preferably from 30 to 80% by mass, relative to the total amount of the polymerizable monomers in the composition. The compound represented by the formula (IV) is preferably used as a reactive diluent.

A monomer having two polymerizable-reactive groups (difunctional polymerizable monomer) is added in an amount of preferably from 10 to 100% by mass, more preferably from 20 to 100% by mass, and particularly preferably from 40 to 100% by mass, relative to the total amount of all the polymerizable monomers.

The proportion of the monofunctional and difunctional polymerizable monomers to be added is preferably from 10 to 100% by mass, more preferably from 30 to 100% by mass, and particularly preferably from 50 to 90% by mass, relative to the total amount of the polymerizable monomers in the composition.

The proportion of the polyfunctional polymerizable monomer having three or more unsaturated bond-having groups is preferably at most 80% by mass, more preferably at most 60% by mass, and particularly preferably at most 40% by mass, relative to the total amount of all the polymerizable monomers. When the proportion of the polymerizable monomer having three or more polymerizable-reactive groups is at 80% by mass or less, the viscosity of the composition can be lowered, thereby it becoming preferable.

(Photopolymerization Initiator)

The curable composition of the present invention comprises a photopolymerization initiator. As the photopolymerization initiator in the present invention, usable is any compound capable of generating an active radical for polymerization of the above-mentioned polymerizable monomer through photoirradiation. As the photopolymerization initiator, preferred are radical polymerization initiators. In the present invention, two or more different types of photopolymerization initiators may be used, as combined.

The content of the photopolymerization initiator may be, for example, from 0.01 to 15% by mass of all the components constituting the composition except solvent, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better.

As the radical photopolymerization initiator for use in the present invention, preferred are acylphosphine oxide compounds and oxime ester compounds from the viewpoint of the curing sensitivity and the absorption characteristics of the composition. The photopolymerization initiator for use in the present invention may be, for example, commercial products. Preferable examples thereof include compounds described in JP-A-2008-105414, [0091].

In the present invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

In particular, when the composition of the present invention is used for nanoimprints, the above-described photopolymerization initiator may be used. Photopolymerizabion initiators not generating gas during the mold compression and the photoexposure are more preferred. Gas generation, if any, may cause mold contamination, therefore giving problems in that the mold must be washed frequently, that the photocurable composition may be deformed in the mold, and that the transferred pattern accuracy may be thereby worsened.
(Other Ingredients)

In addition to the above-mentioned polymerizable monomers and the photopolymerization initiator, the curable composition of the present invention may comprise any other ingredients such as a surfactant, an antioxidant, a solvent, a polymer, a pigment, a dye and others for various purposes not deviating from the effect of the present invention. Preferably, the curable composition of the present invention comprises at least one selected from a surfactant and an antioxidant.
—Surfactant—

Preferably, the curable composition of the present invention comprises a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferred are nonionic surfactants. More preferably, the composition comprises at least one of a fluorine-containing surfactant, a silicone-type surfactant and a fluorine-containing silicone-type surfactant. More preferably, the composition comprises both of a fluorine-containing surfactant and a silicone-type surfactant, or a fluorine-containing silicone-type surfactant. The fluorine-containing surfactant and the silicone-type surfactant is preferably a nonionic surfactant.

"Fluorine-containing silicone-type surfactant" as referred to herein means a surfactant satisfying both the requirement of a fluorine-containing surfactant and that of a silicone-type surfactant.

Using such a surfactant may solve the problem of coating failures such as striation and flaky pattern formation (drying unevenness of resist film) that may occur when the curable composition of the present invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective of enhancing the flowability of the composition of the present invention in the cavity of a female mold, of enhancing the mold-resist releasability, of enhancing the resist adhesiveness to substrates, and of lowering the viscosity of the composition. In particular, when the above-mentioned surfactant is added to the curable composition of the present invention, the coating uniformity of the composition can be greatly improved; and in coating with it using a spin coater or a slit scan coater, the composition ensures good coating aptitude irrespective of the size of the substrate to which it is applied.

The nonionic fluorine-containing surfactant preferably used in the present invention is those disclosed in JP-A-2009-73078, [0072].

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).
—Antioxidant—

Preferably, the curable composition of the present invention comprises a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the present invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include those disclosed in JP-A-2009-73078, [0074]. These may be used either singly or as combined.
—Polymerization Inhibitor—

Furthermore, the curable composition of the present invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount.
—Solvent—

A solvent may be used for the curable composition of the present invention, in accordance with various needs. In particular, when a pattern having a thickness of at most 500 nm is formed, the composition preferably comprises a solvent. Preferably, the solvent has a boiling point at normal pressure of from 80 to 200° C. Regarding the type of the solvent, any solvent capable of dissolving the composition may be used.

Examples of the solvents include solvents having an ester structure, an ketone structure, a hydroxyl group, an ether structure. Preferred among them are solvents having at least any one of an ester structure, a ketone structure, a hydroxyl group and an ether structure in view of evenness of a coated thin layer. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition of the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition, more preferably from 0 to 97% by mass. In forming a patter having a thickness of at most 500 nm, the solvent content is preferably from 20 to 99% by mass, more preferably from 40 to 99% by mass, further more preferably from 70 to 98% by mass.

—Oligomer and Polymer Ingredient—

The composition of the present invention may comprise a polyfunctional oligomer having a larger molecular weight than that of the above-mentioned, other polyfunctional monomer within a range capable of attaining the object of the present invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition of the present invention may comprise any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the polymer ingredient having a molecular weight of at least 2000 in the composition of the present invention is at most 30% by mass of the composition except the solvent therein, then the patternability of the composition is bettered. From the viewpoint of the patternability of the composition, the resin content therein is preferably as small as possible, and except for the surfactant and other minor additives, preferably, the composition does not comprise any additional resin ingredient.

For the purpose of further enhancing the peelability, the composition of the present invention may comprise a release agent. Specifically, the release agent is added for the purpose of neatly releasing a mold that was pressed into a layer of the composition of the present invention, without causing the roughness of surface and without leaving a residual part of the composition of the present invention adhered on the mold. The release agent usable in the present invention may be known release agents including a silicone-type release agent, a solid wax such as a polyethylene wax, an amide wax, and Teflon® powder, a fluorine-type compound, and a phosphate-type compound. Those release agents may be adhered into a mold.

The silicone-type release agent is particularly excellent in peelability from the mold when combined with the composition of the present invention, thereby hardly leaving a residual part of the composition of the present invention adhered on the mold. The silicone-type release agent has an organopolysiloxane structure as the base structure. Examples thereof include a unmodified or modified silicone oil, a polysiloxane having trimethyl siloxysilicate, a silicone-type acryl resin. In addition, a silicone-type leveling agent which is generally used in a hard coating composition may be applied.

The modified silicone oil is that a polysiloxane is modified at a side chain and/or a terminal thereof, and is divided into a reactive silicone oil and an unreactive silicone oil. Examples of the reactive silicone oil include an amino-modified-type silicone oil, an epoxy-modified-type silicone oil, a carboxyl-modified-type silicone oil, a carbinol-modified-type silicone oil, a methacryl-modified-type silicone oil, a phenol-modified-type silicone oil, a reactive at one side terminal-type silicone oil, and a modified with different kinds of functional groups-type silicone oil. Examples of the unreactive silicone oil include a polyether-modified-type silicone oil, a methyl-styryl-modified-type silicone oil, an alkyl-modified-type silicone oil, a higher fatty ester-modified-type silicone oil, a hydrophilia-specially modified-type silicone oil, a higher alkoxy-modified-type silicone oil, a higher fatty acid-modified-type silicone oil, and a fluorine-modified-type silicone oil.

Two or more modified methods are carried out to one poly siloxane molecular.

The modified silicone oil may have a moderate compatibility with ingredients of the composition. In particular, when a reactive oil having a reactivity with other ingredients for forming a coating film which may be added into the composition is used, a problem such as adhesiveness inhibition, contamination, and degradation of the cured film hardly occur because the silicone oil is fixed into the cured film of the composition of the present invention by a chemical bond. In particular, it is more effective of enhancing adhesiveness to a deposited layer during a deposition process. In the case of a modified silicone which is modified with a functional group having a photo-curability such as a (meth)acryloyl-modified silicone oil and a vinyl-modified silicone oil, the composition after cured are excellent in various properties because of cross-link with an ingredient of the composition of the present invention.

The polysiloxane having trimethylsiloxysilicate is preferred because it easily bleeds out on surface thereof, thereby being excellent in peelability, it is also excellent in adhesiveness even if it bleeds out on surface thereof, and it is excellent in adhesiveness to a metal-deposited layer and an over coating layer.

Two or more of the release agents may be added in combination.

When the release agent is added into the composition of the present invention, the amount to be added is preferably 0.001 to 10% by mass of the total amount of the composition of the present invention, more preferably 0.01 to 5% by mass. When the amount to be added of the release agent is less than the above lower limit, the effect of enhancing peelability between a mold and a layer of the curable composition for imprints may be insufficient. When the amount to be added of the release agent is more than the above upper limit, there may be a problem for roughness of the coating surface due to cissing, a problem that adhesiveness of a substrate or a layer adjusting the substrate, for example a deposition layer, is damaged, or a problem that fracture of coating film in transfer is caused (becoming too weak in the strength of the film), therefore being not preferred.

The composition of the present invention may comprise an organic metal coupling agent in order to enhance heat resistance of the surface structure having a micro-embossed pattern, strength of the surface structure having a micro-embossed pattern, or adhesiveness to a metal-deposited film. In addition, the organic metal coupling agent is effective from the viewpoint of promotion of a thermal-curing reaction. Examples of the organic metal coupling agent for use in the present invention include a silane coupling agent, a titanium coupling agent, a zirconium coupling agent, an aluminium coupling agent, and a tin coupling agent.

Examples of the silane coupling agent for use in the present invention include the silane coupling agent disclosed in JP-A-2009-73078, [0083].

Examples of the titanium coupling agent for use in the present invention include the titanium coupling agent disclosed in JP-A-2009-73078, [0084].

Examples of the zirconium coupling agent for use in the present invention include the zirconium coupling agent disclosed in JP-A-2009-73078, [0085].

Examples of the aluminium coupling agent for use in the present invention include the aluminium coupling agent disclosed in JP-A-2009-73078, [0086].

The organic metal coupling agent may be added in an amount of 0.001 to 10% by mass of the total solid ingredient of the curable composition of the present invention. By adjusting the amount to be added of the organic metal coupling agent to 0.001% by mass or more, there is tendency to be more effective for enhancing the heat resistance, the strength, and the adhesiveness to a deposited layer. By adjusting the amount to be added of the organic metal coupling agent to 10% by mass or less, there is tendency to enhance the stability of the composition and to suppress failure of the formed film.

Examples of commercial products of an ultraviolet absorber include Tinuvin P, and 234, 320, 326, 327, 328 and 213 (the above are manufactured by Ciba-Geigy), and Sumisorb 110, 130, 140, 220, 250, 300, 320, 340, 350, and 400 (the above are manufactured by Sumitomo Chemical Co., Ltd.). The ultraviolet absorber is preferably added at the ratio of 0.01 to 10% by mass, relative to the total amount of the curable composition for imprints.

Examples of commercial products of a light stabilizer include Tinuvin 292, 144, 622LD (the above are manufactured by Ciba-Geigy), Sanol LS-770, 765, 292, 2626, 1114, and 744 (the above are manufactured by Sankyo Chemical Industries).

The light stabilizer is preferably added at the ratio of 0.01 to 10% by mass, relative to the total amount of the curable composition for imprints.

Examples of commercial products of an antiaging agent include Antigene W, S, P, 3C, 6C, RD-G, FR, and AW (the above are manufactured by Sumitomo Chemical Co., Ltd.).

The antiaging agent is preferably added at the ratio of 0.01 to 10% by mass, relative to the total amount of the curable composition for imprints.

The composition of the present invention may comprise a plasticizer for the purpose of adjusting the adhesiveness to a substrate, the film pliability, the hardness. Preferred examples of the plasticizer include dioctylphthalate, didodecylphthalate, trimethyleneglycoldicaproate, dimethylglycolphthalate, tricresylphosphate, dioctyladipate, dibutylsebacate, triacetyladipate, dimethyladipate, diethyladipate, di(n-butyl)adipate, dimethylsuberate, diethylsuberate, and di(n-butyl)suberate. The plasticizer may be arbitrarily added in an amount of 30% by mass or less in the composition, preferably 20% by mass or less, more preferably 10% by mass.

The composition of the present invention may comprise an adhesion promoter for the purpose of adjusting the adhesiveness to a substrate. Examples of the an adhesion promoter for use in the present invention include benzimidazoles, poly benzimidazoles, a pyridine derivative substituted with a lower hydroxyalkyl group, a nitrogen-containing hetero ring compound, urea or thiourea, an organic phosphorus compound, 8-oxyquinoline, 4-hydroxypteridine, 1,10-phenanthroline, 2,2'-bipyridine derivative, a benzotriazole, a phenylenediamine compound, 2-amino-1-phenylethanol, N-phenylethanolamine, N-ethyldiethanolamine, N-ethyldiethanol amine, N-ethyl ethanolamine and a derivative thereof, and a benzothiazole derivative.

The adhesion promoter is preferably added in the amount of 20% by mass or less, more preferably 10% by mass or less, further more preferably 5% by mass or less.

In order to acquire a more effect, the amount to be add is preferably 0.1% by mass.

When the composition of the present invention is cured, a thermal polymerization initiator may also be added if desired. Preferred examples of the thermal polymerization initiator include peroxide and an azo compound, specifically benzoyl peroxide, and tert-butyl-peroxybenzoate, azobisisobutyronitrile.

The composition of the present invention may comprise a photobase generator for the purpose of adjusting a pattern form, sensitivity, etc. Examples of the photobase generator include, 2-nitroglycerinebenzylcyclohexyl carbamate, triphenylmethanol, O-carbamoylhydroxylamide, O-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl 1-zimethyl aminoprophane, N-(2-nitrobenzyloxycarbonyl)pyrrolidine, hexaamminecobalt (III) tris (triphenylmethylborate), 2-benzyl-2-dimethylamino-1-(4-morpholinophenyl)-butanone, 2,6-dimethyl-3,5-diacetyl-4-(2'-nitroohenyl)-1,4-dihydropyridine, 2,6-dimethyl-3,5-diacetyl-4-(2',4'-dinitrophenyl)-1, 4-dihydropyridine.

The composition of the present invention may comprise a colorant for the purpose of improving the visibility of a coating film. As the colorant, a pigment or a dye which is used for a composition for UV ink-jet, a composition for color filters, a composition for CCD image sensor may be used without deviating from the object of the present invention.

The pigment for use in the present invention is preferably those disclosed in JP-A-2008-105414, [0121]. The colorant is preferably added in an amount of 0.001 to 2% by mass, relative to the total amount of the composition.

The composition of the present invention may comprise elastomer particles for the purpose of improving the mechanical strength and the pliability.

The elastomer particles which may be added as an arbitrary ingredient have an average particle size of 10 to 700 nm, more preferably 30 to 300 nm. Examples thereof include elastomer particles of polybutadiene, polyisoprene, butadiene/acrylonitrile copolymer, styrene/butadiene copolymer, styrene/isoprene copolymer, ethylene/propylene copolymer, ethylene/alpha-olefin copolymers, ethylene/alpha-olefin/polyene copolymer, acrylic rubber, butadiene/(meth) acrylic ester copolymer, styrene/butadiene block copolymer, or styrene/isoprene block copolymer. Further, core/shell type particles in which those elastomer particles are coated with a methylmethacrylate polymer, methylmethacrylate/glycidylmethacrylate, or the like may be used. The elastomer particles may have a cross-link structure.

Examples of commercial products of the elastomer particles include Resinous Bond RKB (manufactured by Resinous Chemicals), and Techno MBS-61, MBS-69 (the above are manufactured by Techno polymer Co., Ltd.).

The elastomer particles are used singly or in combination of two or more kinds thereof. The amount of the elastomer to be added is preferably 1 to 35% by mass, more preferably 2 to 30% by mass, further more preferably 3 to 20% by mass.

The composition of the present invention may comprise a basic compound arbitrarily for the purpose of suppressing the cure shrinkage and of improving the heat stability. Examples of the basic compound include an amine, a nitrogen-containing hetero ring compound such as quinoline and quinolizine, a basic alkali metal compound, and a basic alkaline-earth-metals compound. Of those, preferred is an amine from the viewpoints of the compatibility with a polymerizable monomer, and examples of the amine include octylamine, naphthylamine, xylenediamine, benzylamine, diphenylamine, dibutylamine, dioctylamine, dimethylaniline, quinuclidine, tributylamine, trioctylamine, tetramethylethylenediamine, tetramethyl-1,6-hexamethylenediamine; hexamethylenetetramine, and triethanolamine.

The composition of the present invention may comprise a chain transfer agent for the purpose of improving the photocurability. Examples thereof include 4-bis(3-mercaptobutyryloxy) butane, 1,3,5-tris (3-mercaptobutyryloxyethyl) 1,3,5-triazine-2,4,6(1H,3H,5H)-trione, and pentaerythritoltetrakis (3-mercaptobutyrate).

(Viscosity)

The viscosity of all the ingredients except a solvent of the composition of the present invention is preferably 100 mPa·s or less, more preferably 1 to 70 mPa·s, further more preferably 2 to 5 mPa·s, still more preferably 3 to 30 mPa·s.

(Surface Tension)

The composition of the present invention has surface tension in the range of 18 to 30 mN/m, preferably 20 to 28 mN/m.

By adjusting it to the range, the surface smoothness is enhanced.

(Amount of Water)

The composition of the present invention preferably comprises water in an amount of 2.0% by mass or less at the time of the preparation of the composition, preferably 1.5% by mass or less, more preferably 1.0% by mass. By adjusting the amount of water at the time of the preparation to 2.0% by mass or less, the preservability of the composition of the present invention becomes more stability.

(Process for Preparing)

The composition for imprints of the present invention is produced by mixing the above-mentioned ingredients. After the ingredients are mixed, the resulting mixture may be filtered through a filter having a pore size of from 0.003 μm to 5.0 μm, preferably 0.05 μm to 5.0 μm, to give a solution. The ingredients may be mixed and dissolved to prepare the composition, generally at a temperature falling within a range of from 0° C. to 100° C. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

[Patterning Method]

The patterning method (especially micropatterning method) of using the curable composition for imprints of the present invention is described below. The patterning method of the present invention comprises applying the curable composition for imprints of the present invention onto a substrate or a support (base) to form a patterning layer thereon; pressing a mold against the surface of the patterning layer; and irradiating the patterning layer with light, thereby curing the composition of the present invention to form a micropattern.

Here, it is preferable that the curable composition for imprints of the present invention is, after being irradiated with light, further heated and cured. Concretely, the patterning layer comprising at least the composition of the present invention is applied onto a substrate (base or support) and optionally dried to form a layer comprising the composition of the present invention (patterning layer), thereby preparing a pattern acceptor (having the patterning layer formed on the substrate), then a mold is pressed against the surface of the patterning layer of the pattern acceptor to thereby transfer the mold pattern, and the micropatterned layer is cured through photoirradiation. The photoimprint lithography by the patterning method of the present invention may enable lamination and multi-layer patterning, and therefore, may be used in combination with an ordinary thermoimprint.

The curable composition for imprints of the present invention may form a finer micropattern at low cost and with high accuracy by a photoimprint method. Accordingly, the composition of the present invention can form micropatterns heretofore formed by conventional photolithography technology at low cost and with high accuracy. For example, when the composition of the present invention is applied onto a substrate or a support, and the layer comprising the composition is exposed to light, cured, and optionally dried (baked), it thus can be employed as a permanent film of an overcoat layer or an insulating film, and the like for use in liquid-crystal displays (LCD); and the like, and as an etching resist for semiconductor integrated circuits, recording materials, flat panel displays, or the like. In particular, the patterns formed by using the curable composition for imprints of the present invention are excellent in etching property, and can be preferably used as an etching resist in dry etching using fluorocarbon, etc.

In the permanent films (resists for structural members) for use in liquid-crystal displays (LCD) and in production of semiconductor, the resist is preferably prevented from being contaminated as much as possible with metallic or organic ionic impurities in order that the resist does not interfere with the performance of the products. The concentration of the metallic or organic ionic impurities in the curable composition for imprints of the present invention is preferably at most 100 ppm, more preferably at most 1 ppm, and further more preferably at most 10 ppb.

The patterning method (pattern transferring method) with the curable composition for imprints of the present invention is described concretely hereinunder.

In the patterning method of the present invention, the composition of the present invention is first applied onto a support to form a patterning layer thereon.

The coating method for applying the curable composition for imprints of the present invention onto a substrate may be a well known coating method of, for example, a dip coating method, an air knife coating method, a curtain coating method, a wire bar coating method, a gravure coating method, an extrusion coating method, a spin coating method, a slit scanning method, an inkjet method, etc. Particularly preferred are an inkjet method and a spin coating method from the viewpoint of the mold chargeability and reduction of the residual film thickness. The thickness of the patterning method of the composition of the present invention may vary depending on the use thereof, and may be from 0.03 μm to 30 μm or so. The composition of the present invention may be applied in a mode of multilayer coating. In the case where liquid drops are applied on a substrate by an ink-jet method, the amount of the liquid drops is preferably 1 pl to 2 pl. Between the substrate and the patterning method of the composition of the present invention, any other organic layer may be formed, such as a planarizing layer, etc. With that, the patterning layer is not kept in direct contact with the substrate, and therefore, the substrate may be prevented from being contaminated with dust or from being scratched. The pattern to be formed of the composition of the present invention may have good adhesiveness to the organic layer, if any, formed on the substrate.

The substrate (base or support) to which the curable composition for imprints of the present invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the present invention, a mold is pressed against the surface of the patterning layer for transferring the pattern from the mold onto the patterning layer. Accordingly, the micropattern previously formed on the pressing surface of the mold is transferred onto the patterning layer.

The mold material usable in the present invention is described. IN the photoimprint lithography with the composition of the present invention, a light-transmissive material is selected for at least one of the mold material and/or the substrate. In the photoimprint lithography applied to the present invention, the curable composition for imprints of the present invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the present invention, preferably, the photoirradiation is attained while the mold is kept in contact with the patterning layer.

The mold usable in the present invention has a transferable pattern formed thereon. The pattern of the mold may be formed, for example, through photolithography, electronic beam lithography or the like by which a pattern may be formed to a desired processing accuracy. In the present invention, however, the mold patterning method is not specifically defined.

Not specifically defined, the light-transmissive mold material for use in the present invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the present invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the present invention may be processed for surface release treatment for the purpose of enhancing the releasability of the curable composition for imprint of the present invention from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the composition of the present invention, in general, the mold pressure in the patterning method of the present invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the present invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the photoimprint lithography applied to the present invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the curable composition for imprints with mold. The system may be subjected to photoirradiation while still kept in vacuum. In the patterning method of the present invention, the vacuum degree in photoirradiation is preferably from $10^{-1}$ Pa to ordinary pressure.

Light to be used for photoirradiation to cure the curable composition for imprints of the present invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the present invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the present invention, after the pattern layer is cured through photoirradiation, if desired, the cured pattern may be further cured under heat given thereto. The method may additionally includes the post-curing step. Thermal curing of the composition of the present invention after photoirradiation is preferably attained at 150 to 280° C., more preferably at 200 to 250° C. The heating time is preferably from 5 to 60 minutes, more preferably from 15 to 45 minutes.

[Pattern]

The pattern thus formed according to the patterning method of the present invention as described in the above can be used as a permanent film for use in liquid-crystal displays (LCD) and others, or as an etching resist. After its production, the permanent film may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern of the present invention formed by the patterning method of the present invention is also useful as an etching resist. In cases where the pattern of the present invention is used as an etching resist, a nano-order micropattern is first formed on a substrate such as a silicon wafer with a thin film of $SiO_2$ or the like formed thereon, according to the patterning method of the present invention. Next, by etching it with an etching gas, such as hydrogen fluoride, or the like in case of wet etching or $CF_4$, or the like in case of dry etching, a desired pattern can be formed on the substrate. The curable composition for imprints is particularly excellent in resistance to dry etching.

EXAMPLES

The characteristics of the present invention are described more concretely with reference to Production Examples and Examples given below. In the following Examples, the material used, its amount and the ratio, the details of the treatment and the treatment process may be suitably modified or changed not overstepping the scope of the present invention. Accordingly, the present invention should not be limitatively interpreted by the Examples mentioned below.

Example 1

Synthesis of R-1-1-R-1-7

Monofunctional acrylate monomers R-1-1-R-1-7 shown in the table below were synthesized by acrylizing alcohol as the precursor thereof and by purifying it with silica gel-column chromatography.

<Other Monofunctional Monomers>

R-1-8: benzyl acrylate (Biscoat #160, manufactured by Osaka Organic Chemical Industry Ltd.)

R-1-9: 2-ethylhexyl acrylate (manufactured by NIPPON SHOKUBAI)

R-1-10: cyclohexylethyl acrylate (the alcohol as the precursor thereof was acrylized to synthesize it.)

R-1-11: dicyclopentenyl acrylate (FANCRYL FA-513A, manufactured by Hitachi Chemical)

<Measurement of Molecular Weight of Monomer>

Molecular weight of the monomers was computed with CS Chem Draw Drawing.

<Measurement of Viscosity of Monomer>

The measurement of viscosity of the monomers R-1-1-R-1-7 was conducted at 25±0.2° C. using a RE-80 L-type rotational viscometer manufactured by Toki Sangyo Co., Ltd.

The measurement of the viscosity was conducted, respectively, by setting the rotation speed in the measurement at 100 rpm in the case of 0.5 mPa·s or more and less than 5 mPa·s, at 50 rpm in the case of 5 mPa·s or more and less than 10 mPa·s, at 20 rpm in the case of 10 mPa·s or more and less than 30 mPa·s, at 10 rpm in the case of 30 mPa·s or more and less than 60 mPa·s, at 5 rpm in the case of 60 mPa·s or more and less than 120 mPa·s, and at 1 rpm or 0.5 rpm in the case of 120 mPa·s or more. The viscosity ranges were classified and evaluated as follows;

A: less than 6 mPa·s

B: not less than 6 mPa·s to less than 10 mPa·s

C: not less than 10 mPa·s

<Measurement of Volatility of Monomer>

0.5 g of each R-1-1 to R-1-11 was weighed, and spread on an aluminum cup. Each weight residual ratio [%] of R-1-1 to R-1-11 after holding for 5 minutes under decompression of less than 0.2 Torr was measured. The result was classified as follows;

A: the residual ratio was in the range of not less than 95%.

B: the residual ratio was in the range of not less than 90% to less than 95%.

C: the residual ratio was in the range of less than 90%.

TABLE 1

| Monomer | R-1-1 | R-1-2 | R-1-3 | R-1-4 |
|---|---|---|---|---|
| Molecular weight | 190 | 204 | 190 | 192 |
| Viscosity | A | A | A | A |
| Volatility | A | A | A | A |

| Monomer | R-1-5 | R-1-6 | R-1-7 |
|---|---|---|---|
| Molecular weight | 241 | 188 | 255 |
| Viscosity | A | A | B |
| Volatility | A | B | A |

TABLE 2

| Monomer | R-1-8 | R-1-9 | R-1-10 | R-1-11 |
|---|---|---|---|---|
| Molecular weight | 162 | 184 | 182 | 206 |
| Viscosity | A | A | A | C |
| Volatility | C | C | C | A |

<Two-Functional Monomer>
S-1: neopentyl glycol diacrylate (manufactured by Nipponkayaku)
S-2: acrylate-2-acryloyloxy-3-aryloxy-propyl ester

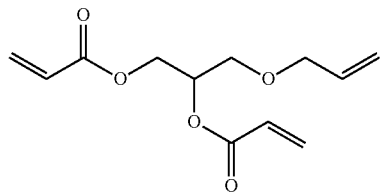 [SMILES: C=CCOCC(COC(=O)C=C)OC(=O)C=C]

The compound was synthesized by the following method.
500 g of aryl glycidyl ether (manufactured by Tokyo Chemicals, A0221), and 331.5 g of acrylic acid (manufactured by Tokyo Chemicals, A0141) were reacted under 14.0 g of tetra-n-butyl ammonium bromide (Tokyo Chemicals, T0054). To the reacted product, 570.5 g of triethyl amine (manufactured by Wako Pure Chem., 202-02046) and 471.0 g of acrylic acid chloride (manufactured by Tokyo Chemicals, A0147) were added to obtain crude product of S-2. The obtained crude product was purified by distillation under reduced pressure (3.7 mmHg, 125° C.) to obtain 656 g of S-2.

<Three-Functional Monomer>
T-1: trimethylolpropane triacrylate (Aronix M-309, manufactured by Toagosei)

<Antioxidant>
A-1: Sumilizer GA80 (manufactured by Sumitomo Chemical Co., Ltd., hindered phenol-type)
A-2: Adecastab A0503 (manufactured by Adeka, thioether-type)
A-3: Irganox1035FF (manufactured by Ciba, hindered phenol-type+thioether-type)
A-4: Adecastab LA-57 (manufactured by Adeka Japan, hindered amine-type)
A-5: TINUVIN144 (manufactured by Ciba, hindered amine-type+hindered phenol-type)

<Photopolymerization Initiator>
P-1: 2,4,6-trimethylbenzoyl-ethoxy phenyl-phosphine oxide (Lucirin TPO-L, manufactured by BASF)

<Nonionic Surfactant>
W-1-1: nonionic surfactant (manufactured by Takemoto Oil, Pionin D6315)
W-1-2: fluorine-containing surfactant (manufactured by DIC Inc. MEGAFACE F780F)

Example 1-1

The polymerizable monomer of R-1-1 (40% by mass), the polymerizable monomer of S-1 (30% by mass), the polymerizable monomer T-1 (30% by mass), the photopolymerization initiator of P-1 (0.5% by mass %, relative to the amount of the total amount of the polymerizable monomers), the antioxidant of A-1 (1.5% by mass, relative to the total amount of the polymerizable monomers), the antioxidant of A-2 (0.5% by mass, relative to the total amount of the polymerizable monomers), the surfactant of W-1-1 (0.1% by mass, relative to the total amount of the polymerizable monomers) and the surfactant of W-1-2 (0.04% by mass, relative to the total amount of the polymerizable monomers) were mixed to prepare the curable composition for imprints of Example 1-1.

(Curing with Photo Irradiation)

The compositions was applied onto a grass substrate in a mode of spin coating to obtain a coating film having a thickness of 3.0 micrometers. The spin-coating film was set to an imprinting device manufactured by ORC, which has a high-pressure mercury vapor lamp as an optical source (the lump power was 2000 mW/cm$^2$). Then, a mold having a line/space pattern with a line width of 10 micrometers and having a groove depth of 4.0 micrometers, of which material was polydimethylsiloxane (that was obtained by curing SILPOT184 manufactured by TORAY/Dow Corning at 80° C., for 60 min.), was used. After setting the inside of the device into a vacuum (the degree of vacuum was 10 Torr, about 1.33 kPa (s)), the mold was pressed against the substrate, and then nitrogen was introduced to the device by conducting the nitrogen purging (1.5 atm: mold pressure). The mold was exposed to light at a luminance of 10 mW/cm$^2$ and a light exposure dose of 240 mJ/cm$^2$ from the back of the mold. After the exposure, the mold was released to give a resist pattern.
(Curing by Heating)

The resist pattern obtained by the above-mentioned method was heated at 230° C. for 30 minutes in oven to completely be cured.

Examples 1-2 to 1-7

Each of curable compositions for imprints of Examples 1-2 to 1-7 as described in the table below was prepared. Each resist pattern was obtained by curing the composition with photo irradiation and with heat as the same method in Example 1-1.

Comparative Example 1-1

In the same manner as in Example 1-1 except that R-1-1 was changed into R-1-8, a composition of Comparative Example 1-1 was prepared and was cured with photo irradiation and with heat to obtain a resist pattern.

Comparative Example 1-2

In the same manner as in Example 1-1 except that R-1-1 was changed into R-1-9, a composition of Comparative Example 1-2 was prepared and was cured with photo irradiation and with heat to obtain a resist pattern.

Comparative Example 1-3

In the same manner as in Example 1-1 except that R-1-1 was changed into R-1-10, a composition of Comparative Example 1-3 was prepared and was cured with photo irradiation and with heat to obtain a resist pattern.

Comparative Example 1-4

In the same manner as in Example 1-1 except that R-1-1 was changed into R-1-11, a composition of Comparative Example 1-4 was prepared and was cured with photo irradiation and with heat to obtain a resist pattern.

The compositions of Examples and Comparative Examples are shown below.

TABLE 3

| | Example 1-1 | | Example 1-2 | | Example 1-3 | | Example 1-4 | | Example 1-5 | | Example 1-6 | | Example 1-7 | |
|---|---|---|---|---|---|---|---|---|---|---|---|---|---|---|
| | Compound | Content | Compound | Content | Compound | Content | Compound | Content | Compound | Content | Compound | Content | Compound | Content |
| Polymerizable monomer | R-1-1 | 40 | R-1-2 | 30 | R-1-3 | 25 | R-1-4 | 35 | R-1-5 | 45 | R-1-6 | 30 | R-1-7 | 40 |
| | S-1 | 30 | S-1 | 40 | S-1 | 15 | S-2 | 35 | S-1 | 25 | S-1 | 40 | S-1 | 30 |
| | T-1 | 30 | T-1 | 30 | S-2 | 40 | T-1 | 30 | S-2 | 10 | T-1 | 30 | T-1 | 30 |
| | | | | | T-1 | 20 | | | T-1 | 20 | | | | |
| Photopolymerizable initiator | P-1 | 0.5 | P-1 | 1 | P-1 | 0.5 | P-1 | 0.5 | P-1 | 0.5 | P-1 | 0.5 | P-1 | 0.5 |
| Antioxidant | A-1 | 1.5 | A-1 | 1.5 | A-1 | 1.5 | A-4 | 2 | A-5 | 2 | A-1 | 1.5 | A-1 | 1.5 |
| | A-2 | 0.5 | A-2 | 0.5 | A-3 | 0.5 | | | | | A-2 | 0.5 | A-2 | 0.5 |
| Surfactant | W-1-1 | 0.1 | W-1-1 | 0.1 | W-1-1 | 0.1 | W-1-1 | 0.1 | W-1-1 | 0.1 | W-1-1 | 0.1 | W-1-1 | 0.1 |
| | W-1-2 | 0.04 | W-1-2 | 0.04 | W-1-2 | 0.04 | W-1-2 | 0.04 | W-1-2 | 0.04 | W-1-2 | 0.04 | W-1-2 | 0.04 |

TABLE 4

| | Comparative Example 1-1 | | Comparative Example 1-2 | | Comparative Example 1-3 | | Comparative Example 1-4 | |
|---|---|---|---|---|---|---|---|---|
| | Compound | Content | Compound | Content | Compound | Content | Compound | Content |
| Polymerizable monomer | R-1-8 | 40 | R-1-9 | 40 | R-1-10 | 40 | R-1-11 | 40 |
| | S-1 | 30 | S-1 | 30 | S-1 | 30 | S-1 | 30 |
| | T-1 | 30 | T-1 | 30 | T-1 | 30 | T-1 | 30 |
| Photopolymerizable initiator | P-1 | 0.5 | P-1 | 0.5 | P-1 | 0.5 | P-1 | 0.5 |
| Antioxidant | A-1 | 1.5 | A-1 | 1.5 | A-1 | 1.5 | A-1 | 1.5 |
| | A-2 | 0.5 | A-2 | 0.5 | A-2 | 0.5 | A-2 | 0.5 |
| Surfactant | W-1-1 | 0.1 | W-1-1 | 0.1 | W-1-1 | 0.1 | W-1-1 | 0.1 |
| | W-1-2 | 0.04 | W-1-2 | 0.04 | W-1-2 | 0.04 | W-1-2 | 0.04 |

<Evaluation>

Each of the compositions of Examples and Comparative Examples was measured and evaluated in accordance with the following evaluation method.

<Measurement of Viscosity of Composition>

The measurement of the viscosity of the composition (before cured) was conducted at 25±0.2° C. using a RE-80 L-type rotational viscometer manufactured by Toki Sangyo Co., Ltd.

The measurement of the viscosity was conducted, respectively, by setting the rotation speed in the measurement at 100 rpm in the case of 0.5 mPa·s or more and less than 5 mPa·s, at 50 rpm in the case of 5 mPa·s or more and less than 10 mPa·s, at 20 rpm in the case of 10 mPa·s or more and less than 30 mPa·s, and at 10 rpm in the case of 30 mPa·s or more and less than 60 mPa·s. The viscosity ranges were classified and evaluated as follows;

A: less than 10 mPa·s
B: not less than 10 mPa·s to less than 14 mPa·s
C: not less than 14 mPa·s <Observation of Pattern Accuracy>

Shape of the resist pattern formed in the above was observed using a scanning electromicroscope or optical microscope. The pattern was classified and evaluated as follows;

A: A pattern is almost the same as the original pattern which forms a pattern of the mold.

B: A pattern has a different part from the original pattern which forms a pattern of the mold (in the range of less than 10%).

C: A pattern has a different part from the original pattern which forms a pattern of the mold (in the range of not less than 10% to less than 20%).

D: A pattern is completely different from the original pattern which forms a pattern of the mold, or has a different part from the original pattern which forms a pattern of the mold (in the range of not less than 20%).

<Dry Etching Resistance>

The curable composition for imprints as prepared above was applied onto an Si wafer, and then while not pressed against a mold, this was exposed to light in a nitrogen atmosphere at a light exposure dose of 240 mJ/cm². Using a dry etcher (U-621) manufactured by Hitachi High-Technology, this was dry-etched with plasma of a gas of $Ar/C_4F_6/O_2=100:4:2$, the residual film amount was measured, and the etching rate per second was computed. The resulting etching rate was standardized, based on the value, 1, in Comparative Example 1-1. By comparison thereto, Examples and Comparative Examples were evaluated. The smaller values indicate better dry etching resistance.

The measurement results are shown in the table below.

TABLE 5

|  | Viscosity | Pattern accuracy | Dry etching resistance |
|---|---|---|---|
| Example 1-1 | A | A | 0.8 |
| Example 1-2 | A | A | 0.8 |
| Example 1-3 | A | A | 0.8 |
| Example 1-4 | A | A | 0.9 |
| Example 1-5 | A | A | 0.9 |
| Example 1-6 | A | A | 0.95 |
| Example 1-7 | B | B | 0.95 |
| Comparative Example 1-1 | A | C | 1.0 |
| Comparative Example 1-2 | A | D | 1.2 |
| Comparative Example 1-3 | A | C | 1.1 |
| Comparative Example 1-4 | C | C | 1.0 |

Examples 1-1 to 1-7 showed good results for the viscosity of the composition and for the pattern accuracy after cured. Comparative Examples 1-1 to 1-3 were poor in the pattern accuracy while the viscosity of the composition was low-level similar to the composition of the present invention. It would appear that a part of diluent having high volatility is volatilized after the liquid was coated before the pattern was formed, and therefore, the viscosity of the residual composition rises. Compared with the composition of the present invention, the composition in Comparative Example 1-4 had higher viscosity, and was poor in the pattern accuracy. It was found that a composition for imprints excellent in the viscosity and the pattern accuracy was obtained by using the polymerizable monomer (Ax).

Example 2

Synthesis Example 1

Synthesis of Polymerizable Monomer I-1

100 ml of 25% hydrobromic acid/acetic acid solution were added to 30 g of diphenyl ether and 21.2 g of paraformaldehyde to react it at 50° C. for 3 hours. To this, 100 ml of 25% hydrobromic acid/acetic acid solution was added to react it for 3 hours. To the reaction liquid, ice was added to obtain a solid. The solid was dissolved in acetone, and water was further added to it. This was filtrated to remove powders and was washed with water. This was washed with methanol and dried to obtain 30 g of 4,4'-bis bromomethyl phenyl ether. To this, 300 ml of N-methylpyrrolidone, 35 g of potassium carbonate, and 18 g of acrylic acid were added to react it at 50° C. for 3 hours. This was extracted with acetic ether, and then, the organic phase thereof was washed with water, dried and concentrated to obtain crude product. 23 g of the polymerizable monomer I-1 was obtained by refining the crude product by column chromatography.

The polymerizable monomer I-1 was liquid at 25° C., and has a viscosity of 63 mPa·s at 25° C.

$^1$H-NMR (CDCl$_3$): delta 5.2 (s, 4H), delta 5.85 (d, 2H), delta 6.2 (dd, 2H), delta 6.45 (d, 2H), delta 7.0 (d, 4H), delta 7.4 (d, 4H)

Synthesis Example 2

Synthesis of Polymerizable Monomer I-2

52 ml of 85% phosphoric acid solution and 100 ml of 30% hydrobromic acid/acetic acid solution were added to 21.5 g of diphenyl methane and 20 g of paraformaldehyde to react it at 110° C. for 6 hours.

After cooled, the precipitated solid was washed with water, reslurried with acetone and dried to obtain 16 g of 4,4'-bis bromomethyl diphenyl methane. To this, 150 ml of N-methylpyrrolidone, 18 g of potassium carbonate, and 9 g of acrylic acid were added to react it at 60° C. for 2 hours. To the reaction liquid, 500 ml of water was added. This was extracted with acetic ether, and then, the organic phase thereof was washed with water, dried and concentrated to obtain crude product. 15 g of the polymerizable monomer I-2 was obtained by refining the crude product by column chromatography.

The polymerizable monomer I-2 was liquid at 25° C.

$^1$H-NMR(CDCl$_3$): delta 4.0 (s, 2H), delta 5.2 (s, 4H), delta 5.85 (d, 2H), delta 6.2 (dd, 2H), delta 6.45 (d, 2H), delta 7.2 (d, 4H), delta 7.3 (d, 4H)

Synthesis Example 3

Each of the polymerizable monomers I-3 and I-4 was synthesized by a similar method to that in the above-mentioned Synthesis Example 1.

(Preparation of Curable Composition)

To the polymerizable monomer descried below in the table, the polymerizable initiator P-1 which is the same as that in Example 1 (2% by mass), the following surface surfactant W-2-1 (0.1% by mass), the following surface surfactant W-2-2 (0.04% by mass), the following antioxidant A-1 which is the same as that in Example 1 (1% by mass), and the antioxidant A-2 which is the same as that in Example 1 (1% by mass) were added. Further, as a polymerizable prohibitior, 4-methoxyphenol was added to be set to 200 ppm, relative to the polymerizable monomer. This was filtered with a 0.1-micrometer filter made of tetrafluoroethylene to prepare the curable composition.

TABLE 6

| | Polymerizable monomer (Ax) | Other polymerizable monomer | |
|---|---|---|---|
| Example 2-1 | I-1 (80) | R-2-1 (20) | |
| Example 2-2 | I-2 (80) | R-2-1 (20) | |
| Example 2-3 | I-3 (20) | R-2-1 (80) | |
| Example 2-4 | I-4 (20) | R-2-1 (80) | |
| Example 2-5 | I-2 (50) | R-2-2 (50) | |
| Example 2-6 | I-2 (50) | R-2-5 (50) | |
| Comparative Example 2-1 | — | R-2-1 (20) | R-2-3 (80) |
| Comparative Example 2-2 | — | R-2-1 (20) | R-2-4 (80) |

<Polymerizable monomer (Ax)>

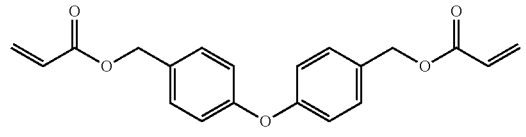

I-1

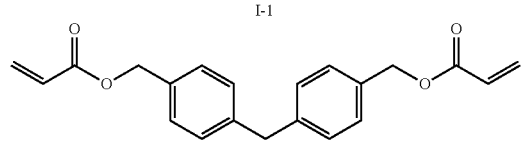

I-2

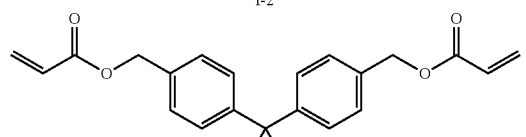

I-3

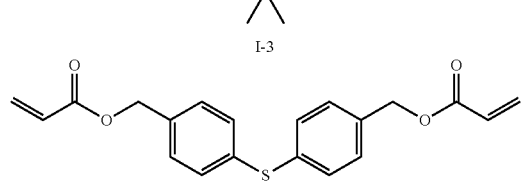

I-4

<Other Polymerizable monomer>
R-2-1: benzylacrylate (Biscoat #160: manufactured by Osaka Organic Chemical Industry Ltd.)
R-2-2: 1-naphty methylacrylate
R-2-3: tetraethylene glycol diacrylate (V#335HP: manufactured by Osaka Organic Chemical Industry Ltd.)
R-2-4: ethoxylated bisphenol A diacrylate (NK Ester A-BPE-10: manufactured by Shin-nakamura Chemical corporation)
R-2-5: 2-ethylhexyl acrylate (manufactured by Aldrich)

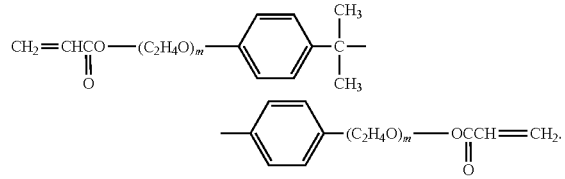

m + n ≈ 10

(Evaluation)
The following evaluations were performed for each of the obtained curable compositions. The results were shown in Table 2.

<Photocurability of Curable Compositon>
The prepared curable composition as prepared above was applied onto a Si wafer, and then, while not pressed against a mold, this was exposed to light in a nitrogen atmosphere at a light exposure dose of 240 mJ/cm$^2$. All of the obtained light-exposed films were tack-free and were good cured films.

<Dry Etching Resistance>
The curable composition for imprints as prepared above was applied onto an Si wafer, and then, while not pressed against a mold, this was exposed to light in a nitrogen atmosphere at a light exposure dose of 240 mJ/cm$^2$. Using a dry etcher (U-621) manufactured by Hitachi High-Technology, this was dry-etched with plasma of a gas of $Ar/C_4F_6/O_2$=100: 4:2, the residual film amount was measured, and the etching rate per second was computed. The resulting etching rate was standardized, based on the value, 1 in Comparative Example 2-1. By comparison thereto, Examples and Comparative Examples were evaluated. The smaller values indicate better dry etching resistance.

<Evaluation of Patternability>
Each of the compositions as prepared above was applied onto a silicone substrate in a mode of spin coating. On the resulting film, a mold of quartz having a rectangular line/space pattern (1/1) with a line width of 100 nm and a groove thickness of 100 nm, of which the surface had been processed with fluorine, was put, and set into a imprinting device. The device was degassed in a vacuum, and then nitrogen was introduced to the device by conducting nitrogen purging. The mold was pressed against the substrate under a pressure of 0.5 MPa at 25° C., and then this was exposed to light under a condition of 240 mJ/cm$^2$ from the back of the mold. After the exposure, the mold was released to give a pattern. It was checked with a scanning electromicroscope and an optical microscope as to whether or not the pattern transfer defects were present or absent therein due to the foreign bodies, and evaluation was conducted in the same manner as below.

A: A rectangular pattern substantially complementary to the mold was obtained.

B: The pattern top was roundish.

C: The pattern top was roundish, and the height of the pattern was low.

TABLE 7

| | Dry etching resistance | Patternability |
|---|---|---|
| Example 2-1 | 0.48 | A |
| Example 2-2 | 0.48 | A |
| Example 2-3 | 0.50 | A |
| Example 2-4 | 0.50 | A |
| Example 2-5 | 0.45 | A |
| Example 2-6 | 0.55 | A |
| Comparative Example 2-1 | 1.0 | A |
| Comparative Example 2-2 | 0.65 | C |

Examples 2-1 to 2-6 in which the polymerizable monomer in the present invention were excellent in the dry etching resistance and the patternability. In particular, Examples 2-1 to 2-5 were more excellent in the dry etching resistance. Comparative Example 2-1 in which the publicly known polymerizable monomer was used, was poor in the dry etching resistance. Comparative Example 2-2 was poor in both of the dry etching resistance and the patternability. In particular, even if a compound which is similar to the compound used in the present invention is used, the effect thereof was remarkably different from the effect of the present invention.

Example 3

Synthesis

Synthesis of 3-phenoxybenzyl acrylate (V-1)

25 g of 3-phenoxy benzyl acrylate was dissolved in 300 ml of acetone, and further 16.4 g of triethylamine and 0.1 g of N,N-dimethylamino pyridine were added. To this, 12.5 g of acrylic acid chloride was added under ice-cold condition, to react it at a room temperature for 2 hours. After adding water and agitating for 30 minutes, this was extracted with ethyl acetate, and the organic phase thereof was wished with dilute hydrochloric acid solution, $NaHSO_3$ solution, and water. The organic phase was dried and concentrated to obtain 29 g of 3-phenoxybenzyl acrylate. It was liquid at 25° C., and had a viscosity of 14.5 mPa·s at 25° C.

Synthesis of 4-acyloxy methyl diphenylmethane (V-2)

6.3 g of 4-bromomethyldiphenylmethane was dissolve in 100 ml of acetonitrile, and 2.3 g of acrylic acid and 5.0 g of potassium carbonate were added to react it for 3 hours at 70° C. To the reaction liquid, ethyl acetate was added, washed with water, dried and concentrated to obtain 4.3 g of 4-acryloxymethyl diphenylmethane. It was liquid at 25° C., and had a viscosity of 1.9 mPa·s at 25° C.

Synthesis of 4-benxyloxy benzyl acrylate (V-3)

It was synthesized by a similar method to that of 3-phenoxy benzyl acrylate. It was liquid at 25° C., and had a viscosity of 25.4 mPa·s at 25° C.

(Preparation of Curable Composition)

To the polymerizable monomer descried below in the following Table 8, the polymerizable initiator P-1 which is the same as that in Example 1 (2% by mass), the surface surfactant W-2-1 (0.1% by mass), the surface surfactant W-2-2 (0.04% by mass), the antioxidant A-1 which is the same as that in Example 1 (1% by mass), the antioxidant A-2 which is the same as that in Example 1 (1% by mass) and perfluorohexyl ethyl acrylate (1% by mass) were mixed. Further, as a polymerizable prohibitior, 4-methoxyphenol was added to be set to 200 ppm, relative to the polymerizable monomer. This was filtered with a 0.1-micrometer filter made of tetrafluoroethylene to prepare the curable composition.

TABLE 8

| | Polymerizable monomer (Ax) | Other polymerizable monomer | |
|---|---|---|---|
| Example 3-1 | V-1 (80) | T-1 (20) | |
| Example 3-2 | V-2 (80) | T-1 (20) | |
| Example 3-3 | V-3 (80) | T-1 (20) | |
| Example 3-4 | V-1 (50) | R-3-2 (50) | |
| Example 3-5 | V-2 (50) | R-3-2 (50) | |
| Example 3-6 | V-3 (50) | R-3-2 (50) | |
| Comparative Example 3-1 | — | T-1 (20) | R-3-1 (80) |
| Comparative Example 3-2 | — | R-3-2 (50) | R-3-1 (50) |

<Other Polymerizable Monomer>
T-1: trimethylolpropane triacrylate (Aronix M-309; manufactured by Toa Gosei Co., Ltd.)
R-3-1: benzyl acrylate (Biscoat #160; manufactured by Osaka Organic Chemical Industry Ltd.)
R-3-2: tricyclodecane dimethanol diacrylate

TABLE 8-continued

| Polymerizable monomer (Ax) | Other polymerizable monomer |
|---|---|

V-1

V-2

V-3

Evaluation for the dry etching resistance and the patternability for each of the obtained Examples and Comparative Examples was measured according to the same method as that in Example 2. The resulting etching rate was standardized, based on the value, 1 in Comparative Example 3-1. By comparison thereto, Examples and Comparative Examples were evaluated. The smaller values indicate better dry etching resistance. The results are shown at the following Table 9.

TABLE 9

| | Dry etching resistance | Patternability |
|---|---|---|
| Example 3-1 | 0.60 | A |
| Example 3-2 | 0.61 | A |
| Example 3-3 | 0.61 | A |
| Example 3-4 | 0.50 | A |
| Example 3-5 | 0.51 | A |
| Example 3-6 | 0.51 | A |
| Comparative Example 3-1 | 1.0 | C |
| Comparative Example 3-2 | 0.80 | B |

Industrial Applicability

The curable composition for imprints of the present invention may be applicable to various imprint techniques. In particular, it is preferably for use in a curable composition for forming a nano-size micropattern. Specifically, the composition of the present invention is for use in micropatterning to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

The present disclosure relates to the subject matter contained in Japanese Patent Application No. 308838/2008 filed on Dec. 3, 2008, Japanese Patent Application No. 5590/2009 filed on Jan. 14, 2009, and Japanese Patent Application No. 176416/2009 filed on Jul. 29, 2009, which are expressly incorporated herein by reference in their entirety.

What is claimed is:

1. A curable composition for imprints comprising a polymerizable monomer (Ax), a polymerizable monomer different from the polymerizable monomer (Ax) and a photopolymerization initiator, wherein the polymerizable monomer (Ax) is represented by the following formula (I):

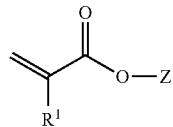

(I)

wherein $R^1$ represents a hydrogen atom, an alkyl group, or a halogen atom; Z is a group having an aromatic group and having a molecular weight of 100 or more, and is represented by $-Z^1-Z^2$; wherein $Z^1$ is a hydrocarbon group; $Z^2$ is an aromatic group having a molecular weight of 90 or more; and $Z^2$ may have a substituent; and, when the polymerizable monomer (Ax) is liquid at 25° C., the polymerizable monomer (Ax) has a viscosity of 500 mPa·s or less, and the polymerizable monomer different from the polymerizable monomer (Ax) is a monofunctional (meth)acrylate having an aromatic structure and/or an alicyclic hydrocarbon structure.

2. The curable composition for imprints according to claim 1, wherein the polymerizable monomer (Ax) is a compound represented by the following formula (II):

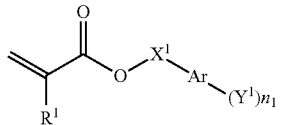

(II)

wherein $R^1$ represents a hydrogen atom, an alkyl group, or a halogen atom; $X^1$ is a hydrocarbon group; $Y^1$ represents a substituent having a molecular weight of 15 or more; n1 represents an integer of 0 to 3; when n1 is 0, $X^1$ is a hydrocarbon group having two or more carbon atoms; and Ar is a phenylene group, or an aromatic group having two or more aromatic rings bonded to each other in series.

3. The curable composition for imprints according to claim 1, wherein the polymerizable monomer (Ax) is a compound represented by the following formula (III):

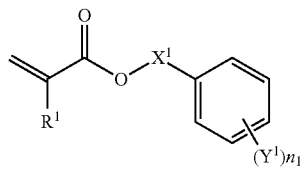

(III)

wherein $R^1$ represents a hydrogen atom, an alkyl group, or a halogen atom; $X^1$ is a hydrocarbon group; $Y^1$ represents a substituent having a molecular weight of 15 or more; n1 represents an integer of 0 to 3; and, when n1 is 0, $X^1$ is a hydrocarbon group having two or more carbon atoms.

4. The curable composition for imprints according to claim 1, wherein the polymerizable monomer (Ax) is a compound represented by the following formula (IV):

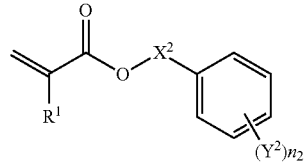

(IV)

wherein $R^1$ represents a hydrogen atom, an alkyl group, or a halogen atom; $X^2$ is a hydrocarbon group; $Y^2$ represents a substituent having a molecular weight of 15 or more, the substituent being other than an aromatic group-containing group; n2 represents an integer of 0 to 3; and, when n2 is 0, $X^2$ is a hydrocarbon group having two or three carbon atoms.

5. The curable composition for imprints according to claim 4, wherein, in the formula (IV), $R^1$ is a hydrogen atom, or a methyl group; $X^2$ is a hydrocarbon group having 1 to 3 carbon atoms; $n^2$ is an integer of 0 to 2; and, when n2 is 2, $X^2$ is a hydrocarbon group having one carbon atom.

6. The curable composition for imprints according to claim 4, wherein the compound represented by the formula (IV) has a molecular weight of 175 to 250.

7. The curable composition for imprints according to claim 4, wherein the compound represented by the formula (IV) has a viscosity of 6 mPa·s or less at 25° C.

8. The curable composition for imprints according to claim 1, wherein the polymerizable monomer (Ax) is a compound represented by the following formula (V):

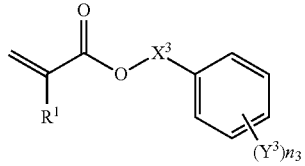

(V)

wherein $R^1$ represents a hydrogen atom, an alkyl group, or a halogen atom; $X^3$ is a hydrocarbon group; $Y^3$ represents a substituent having an aromatic group and having a molecular weight of 15 or more; and n3 represents an integer of 1 to 3.

9. The curable composition for imprints according to claim 8, wherein $R^1$ is a hydrogen atom, or an alkyl group, and $X^3$ is an alkylene group.

10. The curable composition for imprints according to claim 1, wherein the polymerizable monomer (Ax) is a compound represented by the following formula (VI):

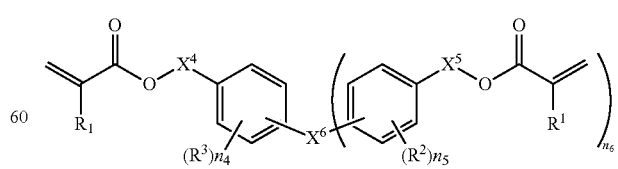

(VI)

wherein $X^6$ is a (n6+1)-valent linking group; each $R^1$ is a hydrogen atom, an alkyl group, or a halogen atom; each of $R^2$ and $R^3$ is a substituent; each of n4 and n5 is an integer of 0 to 4; n6 is 1 or 2; and each of $X^4$ and $X^5$ is a hydrocarbon group.

11. The curable composition for imprints according to claim 10, wherein each of $X^4$ and $X^5$ in the formula (VI) is an alkylene group.

12. The curable composition for imprints according to claim 1, which further comprises a polymerizable compound having a fluorine atom and/or a silicon atom.

13. The curable composition for imprints according to claim 1, which further comprises an antioxidant and/or a surfactant.

14. The curable composition for imprints according to claim 1, which comprises 30% by mass or less of polymerizable monomers having a molecular weight of 2000 or more, relative to the total amount of all the polymerizable monomers contained in the composition.

15. A cured product of the curable composition for imprints according to claim 1.

16. A method for manufacturing a cured product comprising;
applying the curable composition for imprints according to claim 1, onto a substrate to form a patterning layer thereon,
pressing a mold against the surface of the patterning layer, and
irradiating the patterning layer with light.

17. A curable composition for imprints comprising a polymerizable monomer (Ax), a polymerizable monomer different from the polymerizable monomer (Ax), a photopolymerization initiator, a polymerizable compound having a fluorine atom and/or a silicon atom, and an antioxidant and/or a surfactant, wherein the polymerizable monomer (Ax) is represented by the following formula (I):

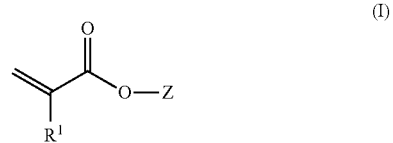

wherein $R^1$ represents a hydrogen atom, an alkyl group, or a halogen atom; Z is a group having an aromatic group and having a molecular weight of 100 or more; and, when the polymerizable monomer (Ax) is liquid at 25° C., the polymerizable monomer (Ax) has a viscosity of 500 mPa·s or less; and the polymerizable monomer different from the polymerizable monomer (Ax) is a monofunctional (meth)acrylate having an aromatic structure and/or an alicyclic hydrocarbon structure.

* * * * *